US012646975B2

(12) United States Patent
Ramakrishnan et al.

(10) Patent No.: US 12,646,975 B2
(45) Date of Patent: *Jun. 2, 2026

(54) POWER TRANSFER ACCOUNTING FOR WIRELESS POWER TRANSFER

(71) Applicant: Apple Inc., Cupertino, CA (US)

(72) Inventors: Shubha Ramakrishnan, San Jose, CA (US); Adam L Schwartz, Redwood City, CA (US); Brandon R Garbus, San Diego, CA (US); Herve Grabas, Mountain View, CA (US); Srinivasa V Thirumalai Ananthan Pillai, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/774,201

(22) Filed: Jul. 16, 2024

(65) Prior Publication Data

US 2025/0096614 A1 Mar. 20, 2025

Related U.S. Application Data

(63) Continuation of application No. 18/617,080, filed on Mar. 26, 2024, and a continuation of application No. 18/617,103, filed on Mar. 26, 2024, now abandoned.

(60) Provisional application No. 63/644,096, filed on May 8, 2024, provisional application No. 63/550,248, filed on Feb. 6, 2024, provisional application No. 63/583,001, filed on Sep. 15, 2023.

(51) Int. Cl.
*H02J 50/60* (2016.01)
*G01R 21/133* (2006.01)
*H02J 50/10* (2016.01)

(52) U.S. Cl.
CPC ............ *H02J 50/60* (2016.02); *G01R 21/133* (2013.01); *H02J 50/10* (2016.02)

(58) Field of Classification Search
CPC .......... H02J 50/60; H02J 50/10; G01R 21/133
USPC ........................................................ 307/104
See application file for complete search history.

(56) References Cited

U.S. PATENT DOCUMENTS

| | | | |
|---|---|---|---|
| 7,560,905 B2 * | 7/2009 | Lafontaine | H02J 50/10 320/166 |
| 7,952,322 B2 * | 5/2011 | Partovi | H01F 5/003 320/108 |
| 8,004,235 B2 * | 8/2011 | Baarman | H02J 50/80 320/108 |
| 8,169,185 B2 * | 5/2012 | Partovi | H01F 27/366 320/108 |
| 8,620,484 B2 | 12/2013 | Baarman | |
| 9,106,083 B2 | 8/2015 | Partovi | |
| 9,294,153 B2 | 3/2016 | Muratov | |
| 9,410,823 B2 | 8/2016 | Widmer et al. | |
| 9,450,648 B2 | 9/2016 | Bastami | |
| 9,505,315 B2 | 11/2016 | Garcia Briz | |
| 9,530,558 B2 | 12/2016 | Nakano et al. | |

(Continued)

FOREIGN PATENT DOCUMENTS

| | | |
|---|---|---|
| CN | 114709943 A | 7/2022 |
| DE | 202016100924 U1 | 5/2017 |

(Continued)

*Primary Examiner* — Alfonso Perez Borroto
(74) *Attorney, Agent, or Firm* — FLETCHER YODER PC

(57) ABSTRACT

Transmitters and/or receivers in a wireless power transfer system predict power losses to account for presence of foreign objects.

46 Claims, 7 Drawing Sheets

(56) References Cited

U.S. PATENT DOCUMENTS

| | | | | |
|---|---|---|---|---|
| 9,716,403 | B2 * | 7/2017 | Ball | H02J 7/007182 |
| 9,929,601 | B2 | 3/2018 | Whit, II et al. | |
| 9,997,929 | B2 | 6/2018 | Yamamoto et al. | |
| 10,103,584 | B2 | 10/2018 | Wagenin | |
| 10,371,848 | B2 | 8/2019 | Roy et al. | |
| 10,530,188 | B2 | 1/2020 | Baarman et al. | |
| 10,530,196 | B2 | 1/2020 | Oettinger et al. | |
| 10,778,048 | B2 | 9/2020 | Van Wageningen et al. | |
| 10,879,743 | B2 | 12/2020 | Vocke et al. | |
| 11,271,428 | B2 | 3/2022 | Nakano et al. | |
| 11,293,957 | B2 | 4/2022 | Van Wageningen et al. | |
| 11,349,347 | B2 | 5/2022 | Park et al. | |
| 11,418,067 | B2 | 8/2022 | Mehas et al. | |
| 11,532,957 | B2 | 12/2022 | Park et al. | |
| 11,581,756 | B2 | 2/2023 | Mynar et al. | |
| 2005/0024165 | A1 | 2/2005 | Hsu | |
| 2008/0164840 | A1 * | 7/2008 | Kato | H02J 50/60 336/200 |
| 2008/0197712 | A1 * | 8/2008 | Jin | H02J 50/80 307/104 |
| 2008/0197804 | A1 * | 8/2008 | Onishi | H02J 50/12 320/108 |
| 2008/0200119 | A1 * | 8/2008 | Onishi | H04B 7/00 455/41.1 |
| 2009/0133942 | A1 * | 5/2009 | Iisaka | H02J 50/10 320/108 |
| 2010/0001845 | A1 * | 1/2010 | Yamashita | H02J 50/40 340/10.4 |
| 2010/0013322 | A1 * | 1/2010 | Sogabe | H04B 5/266 307/104 |
| 2010/0013432 | A1 * | 1/2010 | Toya | H02J 50/70 320/108 |
| 2010/0123430 | A1 * | 5/2010 | Kojima | H02J 50/80 320/108 |
| 2010/0127666 | A1 * | 5/2010 | Ball | H02J 7/007194 320/152 |
| 2010/0315039 | A1 * | 12/2010 | Terao | H01F 38/14 320/108 |
| 2011/0196544 | A1 | 8/2011 | Baarman et al. | |
| 2012/0077537 | A1 | 3/2012 | Muratov et al. | |
| 2013/0076153 | A1 | 3/2013 | Murayama et al. | |
| 2013/0162054 | A1 | 6/2013 | Komiyama | |
| 2013/0175937 | A1 * | 7/2013 | Nakajo | H02J 50/402 315/276 |
| 2014/0015522 | A1 | 1/2014 | Widmer | |
| 2014/0044293 | A1 | 2/2014 | Ganem et al. | |
| 2015/0323694 | A1 | 11/2015 | Roy et al. | |
| 2016/0329751 | A1 | 11/2016 | Mach et al. | |
| 2017/0010307 | A1 | 1/2017 | Komiyama | |
| 2017/0063161 | A1 * | 3/2017 | Sugiyama | H02J 50/80 |
| 2017/0063165 | A1 | 3/2017 | Baarman et al. | |
| 2018/0233954 | A1 | 8/2018 | Yang | |
| 2018/0241257 | A1 | 8/2018 | Muratov et al. | |
| 2019/0068001 | A1 | 2/2019 | Lovas et al. | |
| 2019/0131826 | A1 | 5/2019 | Park et al. | |
| 2019/0165518 | A1 | 5/2019 | Hsu et al. | |
| 2019/0165618 | A1 | 5/2019 | Chen et al. | |
| 2019/0190320 | A1 | 6/2019 | Park | |
| 2019/0296591 | A1 | 9/2019 | Park | |
| 2019/0319494 | A1 | 10/2019 | Park | |
| 2019/0319495 | A1 | 10/2019 | Park et al. | |
| 2020/0083754 | A1 | 3/2020 | Tian et al. | |
| 2020/0169123 | A1 | 5/2020 | Mehas et al. | |
| 2020/0200937 | A1 | 6/2020 | Widmer | |
| 2020/0328616 | A1 | 10/2020 | Wageningen et al. | |
| 2020/0343765 | A1 | 10/2020 | Kwon et al. | |
| 2020/0350788 | A1 | 11/2020 | Park et al. | |
| 2020/0373789 | A1 | 11/2020 | Park | |
| 2021/0066973 | A1 | 3/2021 | Park et al. | |
| 2021/0135506 | A1 | 5/2021 | Muratov | |
| 2021/0351631 | A1 | 11/2021 | Park | |
| 2022/0320911 | A1 | 10/2022 | Schwartz et al. | |
| 2023/0006473 | A1 | 1/2023 | Gao et al. | |
| 2023/0053186 | A1 | 2/2023 | Tokaldani et al. | |
| 2023/0118967 | A1 | 4/2023 | Choi et al. | |
| 2023/0261523 | A1 | 8/2023 | Youn et al. | |
| 2023/0307961 | A1 | 9/2023 | Schwartz et al. | |
| 2023/0336028 | A1 * | 10/2023 | Ohta | H02J 50/005 |

FOREIGN PATENT DOCUMENTS

| | | | |
|---|---|---|---|
| EP | 3393009 | A1 | 10/2018 |
| JP | 2013519355 | A | 5/2013 |
| JP | 2016029887 | A | 3/2016 |
| JP | 2017022999 | A | 1/2017 |
| JP | 2019515629 | A | 6/2019 |
| JP | 2021523670 | A | 9/2021 |
| KR | 10-2017-0118571 | | 10/2017 |
| KR | 10-20180010796 | A | 1/2018 |
| KR | 10-2018-0022513 | A | 3/2018 |
| WO | 2016091764 | A1 | 6/2016 |
| WO | 2017174380 | A1 | 10/2017 |
| WO | 2019229229 | A1 | 12/2019 |
| WO | 2020015746 | A1 | 1/2020 |
| WO | 2020101767 | A1 | 5/2020 |
| WO | 2021194683 | A1 | 9/2021 |
| WO | 2022212094 | A1 | 10/2022 |

* cited by examiner

POWER TRANSFER ACCOUNTING FOR WIRELESS POWER TRANSFER

CROSS-REFERENCE TO RELATED APPLICATIONS

This patent application claims priority to co-pending U.S. Provisional Patent Application 63/583,001, entitled "Power Transfer Accounting for Wireless Power Transfer," filed Sep. 15, 2023; U.S. Provisional Patent Application 63/550, 248, entitled "Power Transfer Accounting for Wireless Power Transfer," filed Feb. 6, 2024; U.S. patent application Ser. No. 18/617,080, entitled "Power Transfer Accounting for Wireless Power Transfer," filed Mar. 26, 2024; U.S. patent application Ser. No. 18/617,103, entitled "Power Transfer Accounting for Wireless Power Transfer," filed Mar. 26, 2024; and U.S. Provisional Patent Application 63/644,096, entitled "Power Transfer Accounting for Wireless Power Transfer," filed May 8, 2024, each of which are hereby incorporated by reference.

BACKGROUND

Wireless power transfer has become increasingly popular in a wide variety of electronic devices. For example, many electronic devices, such as smart phones, tablet computers, smart watches, wireless earphones, styluses, etc. may employ wireless power transfer to facilitate charging of batteries within the devices. In some application, higher levels of wireless power transfer may be desired, for example to provide for faster charging. Such higher power transfer levels can benefit from techniques to detect the presence of foreign objects within the electromagnetic fields associated with the wireless power transfer.

SUMMARY

A method, performed by control circuitry of a wireless power transmitter for detecting a foreign object influenced by an electromagnetic field associated with wireless power transfer from the wireless power transmitter to a wireless power receiver, can include: receiving from the wireless power receiver an indication of receiver power associated with the wireless power transfer including or derived from a corresponding rectifier voltage and rectifier current of the wireless power receiver; determining a measured power loss associated with the wireless power transfer by comparing the indication of receiver power to a transmitter power measured by the wireless power transmitter; computing a predicted power loss based on the indication of receiver power associated with the wireless power transfer including or derived from a corresponding rectifier voltage or rectifier current of the wireless power receiver and one or more coefficients corresponding to a baseline wireless power transmission between the wireless power transmitter and the wireless power receiver; and determining that a foreign object is present if the measured power loss exceeds the predicted power loss by more than a threshold.

The received indication of received power can be the rectifier voltage and rectifier current and the method can further include computing receiver power based on the rectifier voltage and rectifier current. The rectifier voltage can be a rectifier output voltage, and the rectifier current can be a rectifier output current. The transmitter power can be computed by the wireless power transmitter by multiplying an inverter input voltage by an inverter input current.

The method can further include computing the one or more coefficients corresponding to the baseline wireless power transmission between the wireless power transmitter and the wireless power receiver by: receiving from the wireless power receiver a plurality of indications of receiver power including or derived from corresponding rectifier voltages and rectifier currents of the wireless power receiver associated with the wireless power transfer; determining a plurality of measured power loss values each corresponding to one of the plurality of indications of received power levels associated with the wireless power transfer by comparing an indication of receiver power to a corresponding transmitter power measured by the wireless power transmitter; and performing a regression analysis on the received plurality of indications of receiver power and corresponding rectifier voltages and rectifier currents of the wireless power receiver associated with the wireless power transfer and the determined plurality of measured power loss values to compute the one or more coefficients.

Receiving from the wireless power receiver a plurality of indications of receiver power including or derived from corresponding rectifier voltages and rectifier currents of the wireless power receiver associated with the wireless power transfer can include receiving the plurality of indications at three or more operating points. The three or more operating points can include an operating point at minimum rectifier voltage and maximum receiver power, an operating point at nominal rectifier voltage and nominal receiver power, and an operation point at maximum rectifier voltage and minimum receiver power. The plurality of indications at three or more operating points can include a plurality of samples at each of the three or more operating points. The plurality of samples at each of the three or more operating points can include 25 or more samples at each of the three or more operating points.

The one or more coefficients include a first coefficient relating to the rectifier voltage and a second coefficient relating to the rectifier current. The predicted power loss can be of the form:

$$P_{loss} = \alpha V_{rect}^2 + \beta I_{rect}^2$$

where $\alpha$ is the first coefficient relating to the rectifier voltage, and $\beta$ is the second coefficient relating to the rectifier current. Performing the regression analysis on the received plurality of indications of receiver power associated with the wireless power transfer and the determined plurality of measured power loss values to compute the one or more coefficients can further include performing a baselining procedure that includes determining that the plurality of indications of receiver power are linearly independent. The baselining procedure can further include determining that the plurality of indications of receiver power lie in a two-dimensional plane.

Performing the regression analysis on the received plurality of indications of receiver power and corresponding rectifier voltages and rectifier currents of the wireless power receiver associated with the wireless power transfer and the determined plurality of measured power loss values to compute the one or more coefficients can include: computing a first plurality of coefficients corresponding to an initial operating period with a wireless power transfer level below a first threshold in which the absence of a foreign object is indicated by another foreign object detection technique; computing a second plurality of coefficients corresponding to a baseline capture period with a wireless power transfer level above the first threshold; and comparing the first and second plurality of coefficients to determine whether a foreign object was introduced during the baseline capture period.

The method can further include, if a foreign object is present, mitigating presence of the foreign object by reducing a power level of or suspending the wireless power transfer.

A method, performed by control circuitry of a wireless power transmitter for computing one or more coefficients corresponding to a baseline wireless power transmission between the wireless power transmitter and a wireless power receiver to be used in detecting a foreign object influenced by an electromagnetic field associated with wireless power transfer from the wireless power transmitter to the wireless power receiver, can include: receiving from the wireless power receiver a plurality of indications of receiver power levels including or derived from corresponding rectifier voltages and rectifier currents of the wireless power receiver associated with the wireless power transfer; determining a plurality of measured power loss values each corresponding to one of the plurality of indications of receiver power associated with the wireless power transfer by comparing an indication of receiver power to a corresponding transmitter power measured by the wireless power transmitter; and performing a regression analysis on the received plurality of indications of receiver power including or derived from corresponding rectifier voltages and rectifier currents of the wireless power receiver associated with the wireless power transfer and the determined plurality of measured power loss values to compute the one or more coefficients.

The rectifier voltage can be a rectifier output voltage, and the rectifier current can be a rectifier output current. The transmitter power can be computed by the wireless power transmitter by multiplying an inverter input voltage by an inverter input current. The one or more coefficients can include a first coefficient relating to the rectifier voltage and a second coefficient relating to the rectifier current.

Receiving from the wireless power receiver a plurality of indications of receiver power including or derived from corresponding rectifier voltages and rectifier currents of the wireless power receiver associated with the wireless power transfer can include receiving the plurality of indications at three or more operating points. The three or more operating points can include an operating point at minimum rectifier voltage and maximum receiver power, an operating point at nominal rectifier voltage and nominal receiver power, and an operation point at maximum rectifier voltage and minimum receiver power. The plurality of indications at three or more operating points can include a plurality of samples at each of the three or more operating points. The plurality of samples at each of the three or more operating points can include 25 or more samples at each of the three or more operating points.

The method can further include computing a predicted power loss based on the corresponding rectifier voltage and rectifier current and the one or more coefficients, wherein the predicted power loss is of the form:

$$P_{loss} = \alpha V_{rect}^2 + \beta I_{rect}^2$$

where $\alpha$ is the first coefficient relating to the rectifier voltage, and $\beta$ is the second coefficient relating to the rectifier current.

Performing the regression analysis on the received plurality of indications of receiver power and corresponding rectifier voltages and rectifier currents of the wireless power receiver associated with the wireless power transfer and the determined plurality of measured power loss values to compute the one or more coefficients can further include performing a baselining procedure that includes determining that the plurality of indications of received power levels are linearly independent. The baselining procedure can include determining that the plurality of indications of received power levels lie in a two-dimensional plane.

A wireless power transmitter can include: a wireless power transmitter coil configured to magnetically couple to a wireless power receiver coil of a wireless power receiver to wirelessly transfer power to the wireless power receiver; an inverter configured to receive input power and generate an output that drives the wireless power transmitter coil; and controller and communication circuitry coupled to the inverter and the wireless power transmitter coil that controls the inverter to regulate wireless power transfer to the wireless power receiver. The controller and communication circuitry can include logic or programming that detects a foreign object influenced by an electromagnetic field associated with wireless power transfer to the wireless power receiver by: receiving from the wireless power receiver an indication of receiver power associated with the wireless power transfer including or derived from a corresponding rectifier voltage and rectifier current of the wireless power receiver; determining a measured power loss associated with the wireless power transfer by comparing the indication of receiver power to a transmitter power measured by the wireless power transmitter; computing a predicted power loss based on the indication of receiver power associated with the wireless power transfer including or derived from a corresponding rectifier voltage and rectifier current of the wireless power receiver and one or more coefficients corresponding to a baseline wireless power transmission between the wireless power transmitter and the wireless power receiver; and determining that a foreign object is present if the measured power loss exceeds the predicted power loss by more than a threshold.

The rectifier voltage can be a rectifier output voltage, and the rectifier current can be a rectifier output current. The transmitter power can be computed by the wireless power transmitter by multiplying an inverter input voltage by an inverter input current. The controller and communication circuitry can further include logic or programming that computes the one or more coefficients corresponding to the baseline wireless power transmission between the wireless power transmitter and the wireless power receiver by: receiving from the wireless power receiver a plurality of indications of receiver power including or derived from corresponding rectifier voltages and rectifier currents of the wireless power receiver associated with the wireless power transfer; determining a plurality of measured power loss values each corresponding to one of the plurality of indications of receiver power associated with the wireless power transfer by comparing an indication of receiver power to a corresponding transmitted wireless power level measured by the wireless power transmitter; and performing a regression analysis on the received plurality of indications of receiver power including or derived from corresponding rectifier voltages and rectifier currents of the wireless power receiver associated with the wireless power transfer and the determined plurality of measured power loss values to compute the one or more coefficients.

Receiving from the wireless power receiver a plurality of indications of receiver power including or derived from corresponding rectifier voltages and rectifier currents of the wireless power receiver associated with the wireless power transfer can include receiving the plurality of indications at three or more operating points. The three or more operating points can include an operating point at minimum rectifier voltage and maximum receiver power, an operating point at nominal rectifier voltage and nominal receiver power, and an operation point at maximum rectifier voltage and minimum receiver power. The plurality of indications at three or more operating points can include a plurality of samples at each of the three or more operating points. The plurality of samples at each of the three or more operating points can include 25 or more samples at each of the three or more operating points.

The one or more coefficients can include a first coefficient relating to the rectifier voltage and a second coefficient relating to the rectifier current. The predicted power loss can be of the form:

$$P_{loss} = \alpha V_{rect}^2 + \beta I_{rect}^2$$

where $\alpha$ is the first coefficient relating to the rectifier voltage, and $\beta$ is the second coefficient relating to the rectifier current. Performing the regression analysis on the received plurality of indications of receiver power including or derived from corresponding rectifier voltages and rectifier currents of the wireless power receiver associated with the wireless power transfer and the determined plurality of measured power loss values to compute the one or more coefficients can include performing a baselining procedure including determining that the plurality of indications of receiver power are linearly independent. The baselining procedure can further include determining that the plurality of indications of receiver power lie in a two-dimensional plane.

The controller and communication circuitry further comprise logic or programming that, if a foreign object is present, mitigates presence of the foreign object by reducing a power level of or suspending the wireless power transfer.

A wireless power transmitter can include: a wireless power transmitter coil configured to magnetically couple to a wireless power receiver coil of a wireless power receiver to wirelessly transfer power to the wireless power receiver; an inverter configured to receive input power and generate an output that drives the wireless power transmitter coil; and controller and communication circuitry coupled to the inverter and the wireless power transmitter coil that controls the inverter to regulate wireless power transfer to the wireless power receiver. The controller and communication circuitry can include logic or programming that that computes one or more coefficients corresponding to a baseline wireless power transmission between the wireless power transmitter and the wireless power receiver by: receiving from the wireless power receiver a plurality of indications of receiver power including or derived from corresponding rectifier voltages and rectifier currents of the wireless power receiver associated with the wireless power transfer; determining a plurality of measured power loss values each corresponding to one of the plurality of indications of receiver power associated with the wireless power transfer by comparing an indication of receiver power to a corresponding transmitted wireless power level measured by the wireless power transmitter; and performing a regression analysis on the received plurality of indications of receiver power including or derived from corresponding rectifier voltages and rectifier currents of the wireless power receiver associated with the wireless power transfer and the determined plurality of measured power loss values to compute the one or more coefficients.

The rectifier voltage can be a rectifier output voltage, and the rectifier current can be a rectifier output current. The transmitter power can be computed by the wireless power transmitter by multiplying an inverter input voltage by an inverter input current. The one or more coefficients can include a first coefficient relating to the rectifier voltage and a second coefficient relating to the rectifier current.

Receiving from the wireless power receiver a plurality of indications of receiver power including or derived from corresponding rectifier voltages and rectifier currents of the wireless power receiver associated with the wireless power transfer can include receiving the plurality of indications at three or more operating points. The three or more operating points can include an operating point at minimum rectifier voltage and maximum receiver power, an operating point at nominal rectifier voltage and nominal receiver power, and an operation point at maximum rectifier voltage and minimum receiver power. The plurality of indications at three or more operating points can include a plurality of samples at each of the three or more operating points. The plurality of samples at each of the three or more operating points can include 25 or more samples at each of the three or more operating points.

The controller and communication circuitry can further include logic or programming that computes a predicted power loss based on the corresponding rectifier voltage and rectifier current and the one or more coefficients, and wherein the predicted power loss is of the form:

$$P_{loss} = \alpha V_{rect}^2 + \beta I_{rect}^2$$

where $\alpha$ is the first coefficient relating to the rectifier voltage, and $\beta$ is the second coefficient relating to the rectifier current. Performing the regression analysis on the received plurality of indications of receiver power including or derived from corresponding rectifier voltages and rectifier currents of the wireless power receiver associated with the wireless power transfer and the determined plurality of measured power loss values to compute the one or more coefficients can include performing a baselining procedure including determining that the plurality of indications of received power levels are linearly independent. The baselining procedure can further include determining that the plurality of indications of received power levels lie in a two-dimensional plane.

DETAILED DESCRIPTION

Figure 1:
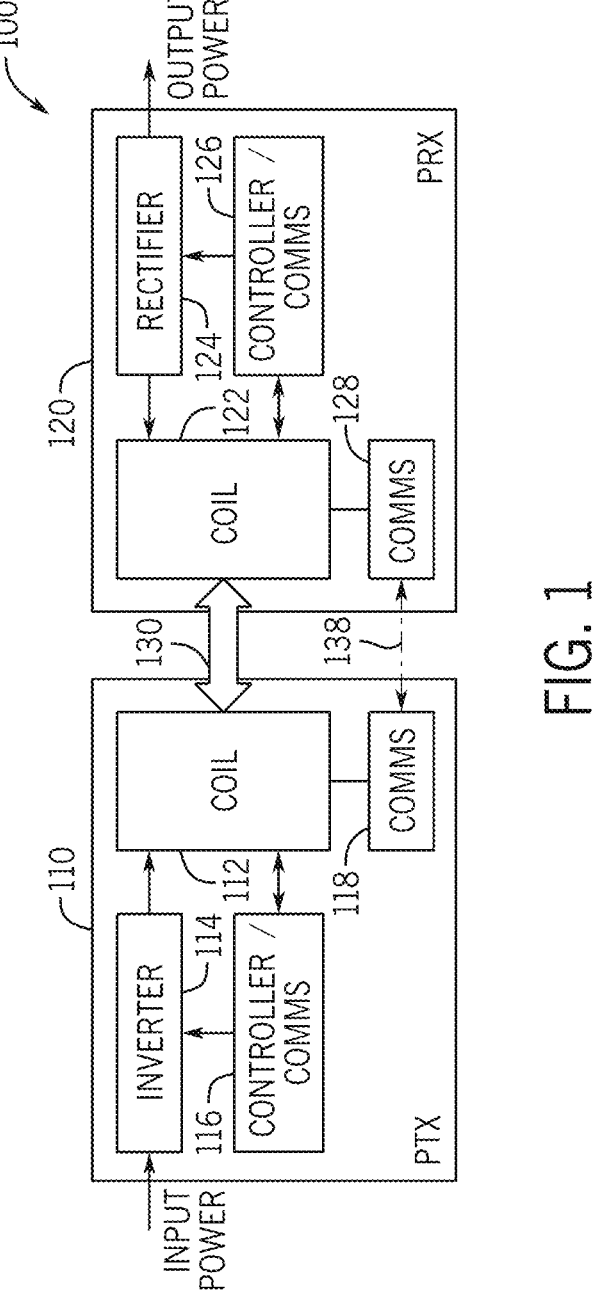
FIG. 1 illustrates a simplified block diagram of a wireless power transfer system.

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth to provide a thorough understanding of the implementations described herein. In other instances, methods, procedures, and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

FIG. 1 illustrates a simplified block diagram of a wireless power transfer system 100. Wireless power transfer system includes a power transmitter (PTx) 110 that transfers power to a power receiver (PRx) 120 wirelessly, such as via inductive coupling 130. Power transmitter 110 may receive input power that is converted to an AC voltage having particular voltage and frequency characteristics by an inverter 114. Inverter 114 may be controlled by a controller/communications module 116 that operates as further described below. In various embodiments, the inverter controller and communications module may be implemented in a common system, such as a system based on a microprocessor, microcontroller, or the like. In other embodiments, the inverter controller may be implemented by a separate controller module and communications module that have a means of communication between them. Inverter 114 may be constructed using any suitable circuit topology (e.g., full bridge, half bridge, etc.) and may be implemented using any suitable semiconductor switching device technology (e.g., MOSFETs, IGBTs, etc. made using silicon, silicon carbide, or gallium nitride devices).

Inverter 114 may deliver the generated AC voltage to a transmitter coil 112. In addition to a wireless coil allowing magnetic coupling to the receiver, the transmitter coil block 112 illustrated in FIG. 1 may include tuning circuitry, such as additional inductors and capacitors, that facilitate operation of the transmitter in different conditions, such as different degrees of magnetic coupling to the receiver, different operating frequencies, etc. The wireless coil itself may be constructed in a variety of different ways. In some embodiments, the wireless coil may be formed as a winding of wire around a suitable bobbin. In other embodiments, the wireless coil may be formed as traces on a printed circuit board. Other arrangements are also possible and may be used in conjunction with the various embodiments described herein. The wireless transmitter coil may also include a core of magnetically permeable material (e.g., ferrite) configured to affect the flux pattern of the coil in a way suitable to the particular application. The teachings herein may be applied in conjunction with any of a wide variety of transmitter coil arrangements appropriate to a given application.

PTx controller/communications module 116 may monitor the transmitter coil and use information derived therefrom to control the inverter 114 as appropriate for a given situation. For example, controller/communications module may be configured to cause inverter 114 to operate at a given frequency or output voltage depending on the particular application. In some embodiments, the controller/communications module may be configured to receive information from the PRx device and control inverter 114 accordingly. This information may be received via the power transmission coils (i.e., in-band communication) or may be received via a separate communications channel (not shown, i.e., out-of-band communication). For in-band communication, controller/communications module 116 may detect and decode signals imposed on the magnetic link (such as voltage, frequency, or load variations) by the PRx to receive information and may instruct the inverter to modulate the delivered power by manipulating various parameters of the generated voltage (such as voltage, frequency, etc.) to send information to the PRx. In some embodiments, controller/communications module may be configured to employ frequency shift keying (FSK) communications, in which the frequency of the inverter signal is modulated, to communicate data to the PRx. Controller/communications module 116 may be configured to detect amplitude shift keying (ASK) communications or load modulation-based communications from the PRx. In either case, the controller/communications module 126 may be configured to vary the current drawn on the receiver side to manipulate the waveform seen on the Tx coil to deliver information from the PRx to the PTx. For out-of-band communication, additional modules that allow for communication between the PTx and PRx may be provided, for example, WiFi, Bluetooth, or other radio links or any other suitable communications channel.

As mentioned above, controller/communications module 116 may be a single module, for example, provided on a single integrated circuit, or may be constructed from multiple modules/devices provided on different integrated circuits or a combination of integrated and discrete circuits having both analog and digital components. The teachings herein are not limited to any particular arrangement of the controller/communications circuitry.

PTx device 110 may optionally include other systems and components, such as a separate communications module 118. In some embodiments, comms module 118 may communicate with a corresponding module tag in the PRx via the power transfer coils. In other embodiments, comms module 118 may communicate with a corresponding module using a separate physical channel 138.

As noted above, wireless power transfer system also includes a wireless power receiver (PRx) 120. Wireless power receiver can include a receiver coil 122 that may be magnetically coupled 130 to the transmitter coil 112. As with transmitter coil 112 discussed above, receiver coil block 122 illustrated in FIG. 1 may include tuning circuitry, such as additional inductors and capacitors, that facilitate operation of the transmitter in different conditions, such as different degrees of magnetic coupling to the receiver, different operating frequencies, etc. The wireless coil itself may be constructed in a variety of different ways. In some embodiments, the wireless coil may be formed as a winding of wire around a suitable bobbin. In other embodiments, the wireless coil may be formed as traces on a printed circuit board. Other arrangements are also possible and may be used in conjunction with the various embodiments described herein. The wireless receiver coil may also include a core of magnetically permeable material (e.g., ferrite) configured to affect the flux pattern of the coil in a way suitable to the particular application. The teachings herein may be applied in conjunction with any of a wide variety of receiver coil arrangements appropriate to a given application.

Receiver coil 122 outputs an AC voltage induced therein by magnetic induction via transmitter coil 112. This output AC voltage may be provided to a rectifier 124 that provides a DC output power to one or more loads associated with the PRx device. Rectifier 124 may be controlled by a controller/communications module 126 that operates as further described below. In various embodiments, the rectifier controller and communications module may be implemented in a common system, such as a system based on a microprocessor, microcontroller, or the like. In other embodiments, the rectifier controller may be implemented by a separate controller module and communications module that have a means of communication between them. Rectifier 124 may be constructed using any suitable circuit topology (e.g., full bridge, half bridge, etc.) and may be implemented using any suitable semiconductor switching device technology (e.g., MOSFETs, IGBTs, etc. made using silicon, silicon carbide, or gallium nitride devices).

PRx controller/communications module 126 may monitor the receiver coil and use information derived therefrom to control the rectifier 124 as appropriate for a given situation. For example, controller/communications module may be configured to cause rectifier 124 to operate provide a given output voltage depending on the particular application. In some embodiments, the controller/communications module may be configured to send information to the PTx device to effectively control the power delivered to the receiver. This information may be received sent via the power transmission coils (i.e., in-band communication) or may be sent via a separate communications channel (not shown, i.e., out-of-band communication). For in-band communication, controller/communications module 126 may, for example, modulate load current or other electrical parameters of the received power to send information to the PTx. In some embodiments, controller/communications module 126 may be configured to detect and decode signals imposed on the magnetic link (such as voltage, frequency, or load variations) by the PTx to receive information from the PTx. In some embodiments, controller/communications module 126 may be configured to receive frequency shift keying (FSK) communications, in which the frequency of the inverter signal has been modulated to communicate data to the PRx. Controller/communications module 126 may be configured to generate amplitude shift keying (ASK) communications or load modulation-based communications from the PRx. In either case, the controller/communications module 126 may be configured to vary the current drawn on the receiver side to manipulate the waveform seen on the Tx coil to deliver information from the PRx to the PTx. For out-of-band communication, additional modules that allow for communication between the PTx and PRx may be provided, for example, WiFi, Bluetooth, or other radio links or any other suitable communications channel.

As mentioned above, controller/communications module 126 may be a single module, for example, provided on a single integrated circuit, or may be constructed from multiple modules/devices provided on different integrated circuits or a combination of integrated and discrete circuits having both analog and digital components. The teachings herein are not limited to any particular arrangement of the controller/communications circuitry. PRx device 120 may optionally include other systems and components, such as a communications ("comms") module 128. In some embodiments, comms module 128 may communicate with a corresponding module in the PTx via the power transfer coils. In other embodiments, comms module 128 may communicate with a corresponding module or tag using a separate physical channel 138.

Numerous variations and enhancements of the above-described wireless power transmission system 100 are possible, and the following teachings are applicable to any of such variations and enhancements.

In a wireless power transfer system, it may be desirable to detect the presence of a conductive foreign object that is within the influence of the wireless power transfer magnetic field, for example, to mitigate undesirable heating of such a foreign object. There are numerous techniques to perform such foreign object detection. One class of such techniques can be based on power accounting. In power accounting techniques, the wireless power transmitter can receive from the wireless power receiver a communication indicating the amount of power that the wireless power receiver has received. The receiver can compute its received power by various techniques, e.g., monitoring its rectifier voltage and coil current, etc. The received power can be computed as the product of these values. The receiver can communicate this value back to the wireless power transmitter using in-band or out-of-band communications, as described above. In some cases, such communications may take a form prescribed by an industry standard, such as the Qi wireless power transfer standards promulgated by the Wireless Power Consortium, or by a proprietary protocol. The wireless power transmitter can compare the wireless power receiver's received power value to the amount of power that the wireless power transmitter transmitted. The wireless power transmitter can compute this value in various ways, e.g., the product of the inverter output voltage and wireless power transmit coil current.

The difference between the power transmitted by the wireless power transmitter and the power received by the wireless power receiver is the power loss. This power loss can include losses associated with so-called "friendly metal" of the wireless power transmitter and receiver as well as any losses associated with a potential foreign object. Various techniques can be employed that allow the friendly metal losses to be accounted for. For example, the wireless power receiver can provide the wireless power transmitter with information programmed into the wireless power receiver at manufacture allowing the wireless power transmitter to estimate the losses associated with the friendly metal of the wireless power receiver. Similarly, the wireless power transmitter can be programmed at manufacture with information that allows it to estimate its own friendly metal losses. In some cases, additional calibration mechanisms can be provided allowing for the friendly metal loss estimation parameters of the wireless power receiver and/or the wireless power transmitter to be updated over time. In any case, once the friendly metal losses are accounted for, any remaining losses can be assumed to be associated with the presence of a foreign object. If the foreign object losses exceed a threshold, which may be a predetermined static threshold or a dynamic threshold, then wireless power transmission can be reduced or inhibited to prevent undesired heating of a foreign object.

Exemplary foreign object detection techniques based on power accounting are described in Applicant's U.S. Provisional Patent Application 63/581,318, filed Sep. 8, 2023, which is incorporated by reference herein together with all references incorporated into said application. Such techniques may be used in conjunction with the further foreign object detection techniques described below.

Figure 2:
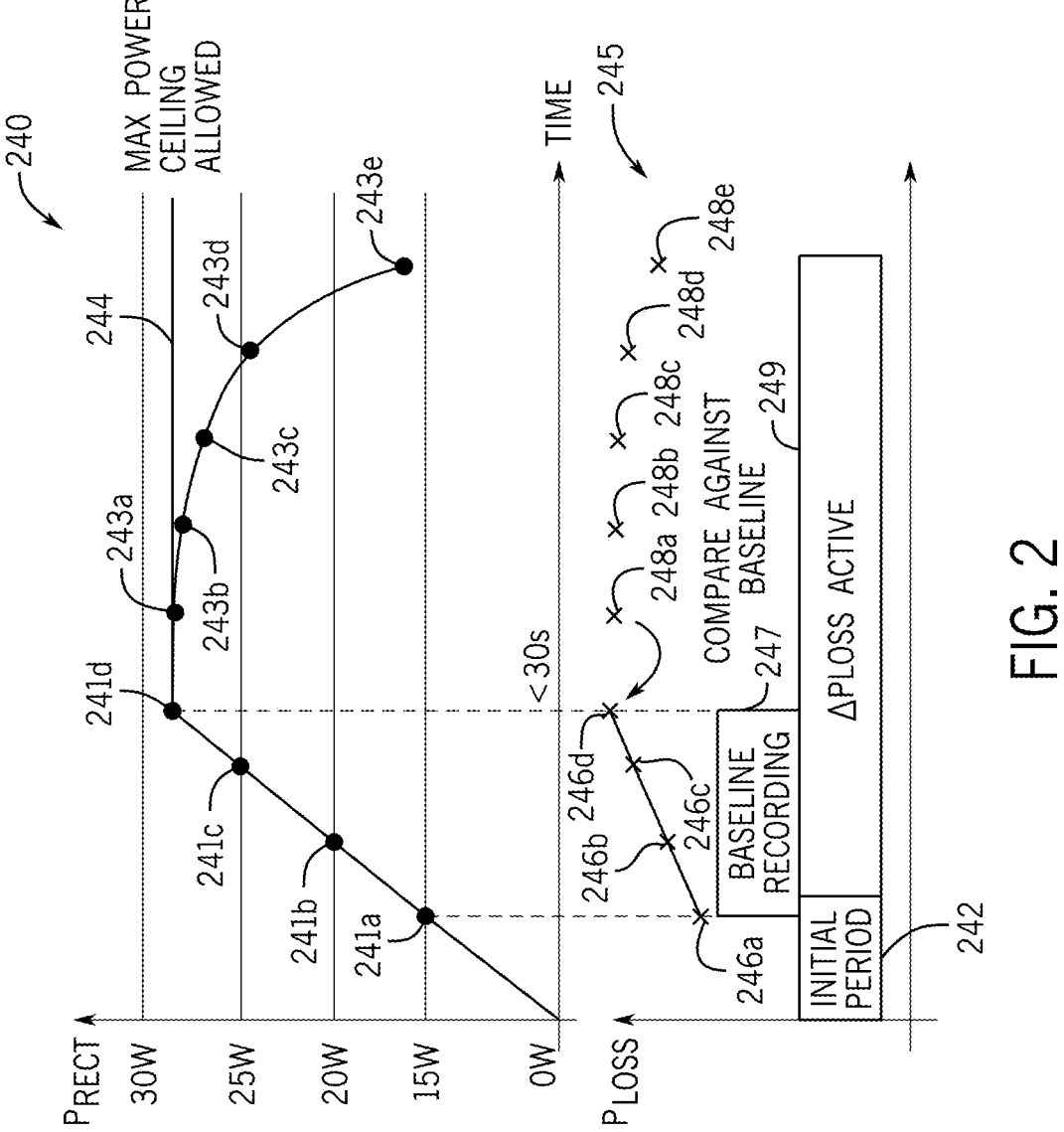
FIG. 2 illustrates a plot of power measurements that can be used to detect foreign objects using a power loss measurement in a wireless power transfer system.

FIG. 2 illustrates plots 240 and 245 of power measurements that can be used to detect foreign objects using a power loss measurement in a wireless power transfer system. The upper plot 240 illustrates a series of wireless power receiver power measurements 241a-241d and 243a-243e made over a period of time beginning with the initiation of wireless power transfer. As illustrated in plot 240, the power level can start at a level of 0 W and ramp up initially to a first value such as 15 W (power measurement 241a) during an initial operating period 242. Assuming that no foreign object is detected in this initial operating period 242, the received power level can continue increasing to an even higher (second) power level, e.g., 28 W corresponding to power measurement 241d, during a baseline recording period 247. This higher second value of power level can correspond to a maximum power ceiling 244. Subsequently, operating received power measurements 243a-243e can be made during a delta power loss active time period 249 (which can include or overlap with the baseline recording period 247) to be used in conjunction with baseline values determined as explained in greater detail below to determine whether a foreign object is present. These power measurements 243a-243e may show a decrease in power over time, e.g., as a battery being charged by the wireless power receiver approaches a fully charged state and the rate of charging decreases accordingly or if power is decreased, e.g., to regulate battery temperature.

Lower plot 245 of FIG. 2 illustrates power loss measurements 246a-246d (from the baseline recording period, sometimes referred to as baselining phase when baseline losses are determined) and 248a-248e (from the higher level power transfer operating period when delta power loss measurements are taken and compared with baseline values). These power loss measurements 246a-246d and 248a-248e respectively correspond to wireless power received measurements 241a-241d and 243a-243e discussed above. The power loss measurements 246a-246d and 248a-248e can be made by wireless power transmitter according to the general principles and techniques described above and in Applicant's other patent applications referenced above. For example, the power loss measurements can be made by comparing the wireless power receiver received power to the wireless power transmitter transmitted power. Embodiments of the power loss regime described herein further optimize power loss measurements to inherently account for associated friendly metal losses, as described in greater detail herein. As a result, each wireless power receiver power measurement 241a-241d and 243a-243e can have an associated or corresponding power loss measurement 246a-246d and 248a-248e.

During the initial operating period 242, foreign object detection can be performed by techniques described in the applications incorporated by reference above, with those techniques providing indication of and protection against introduction of foreign objects during initial operating period 242. Once a first threshold power level of the initial operating regime is reached (e.g., 15 W received power measurement 241a), the power loss regime 249 can begin with baseline recording period 247. During this baseline recording period, the transmitted power can further increase to a second, higher (e.g., maximum) power level of the PTx and PRx system design. In the example of FIG. 2, the wireless power system is designed to operate below 30 W as indicated by received power measurement 241d. Although 28 W and 30 W are used as the upper ends of a higher power operating regime in the illustrated example, other power levels for this boundary could also be implemented. At these threshold power levels and at one or more intermittent power levels corresponding to received power measurements 241b, 241c, baseline power loss values can be computed, so that for each received power measurement 241a-241d, there is a corresponding power loss value 246a-246d derived by the wireless power transmitter. Once the maximum power ceiling 244 is reached (corresponding to power measurement 241d and power loss baseline value 246d), the baseline regime is completed. The measured baseline values can be used as described in greater detail below with respect to FIGS. 3 and 4 to derive information, e.g., coefficients, that can be further used for foreign object detection. More specifically, such coefficients can be used to predict power loss for a given received power measurement from the wireless power receiver. If an actual power loss determined by the wireless power transmitter exceeds a predicted power loss based on a received power measurement (i.e., a power loss) by more than a predetermined threshold, then it can be assumed that a foreign object is present and mitigating steps (such as reducing, pausing, and/or stopping wireless power transfer) can be taken. For example, power may be reduced to the first threshold level described above, e.g., 15 W. This technique is further described below with reference to FIGS. 7 & 9. Additionally, a PRx device may request re-baselining and/or a PTx device may initiate re-baselining based on any detected change in operating conditions. Such re-baselining may include a reversion to the first threshold level as an initial step. For example, a PRx may request re-baselining upon re-tuning its resonant circuit for power transfer and/or data communication optimization.

Embodiment 1: Determining $P_{LOSS}$ Based on $P_{RECT}^2$ Measurements

Figure 3:
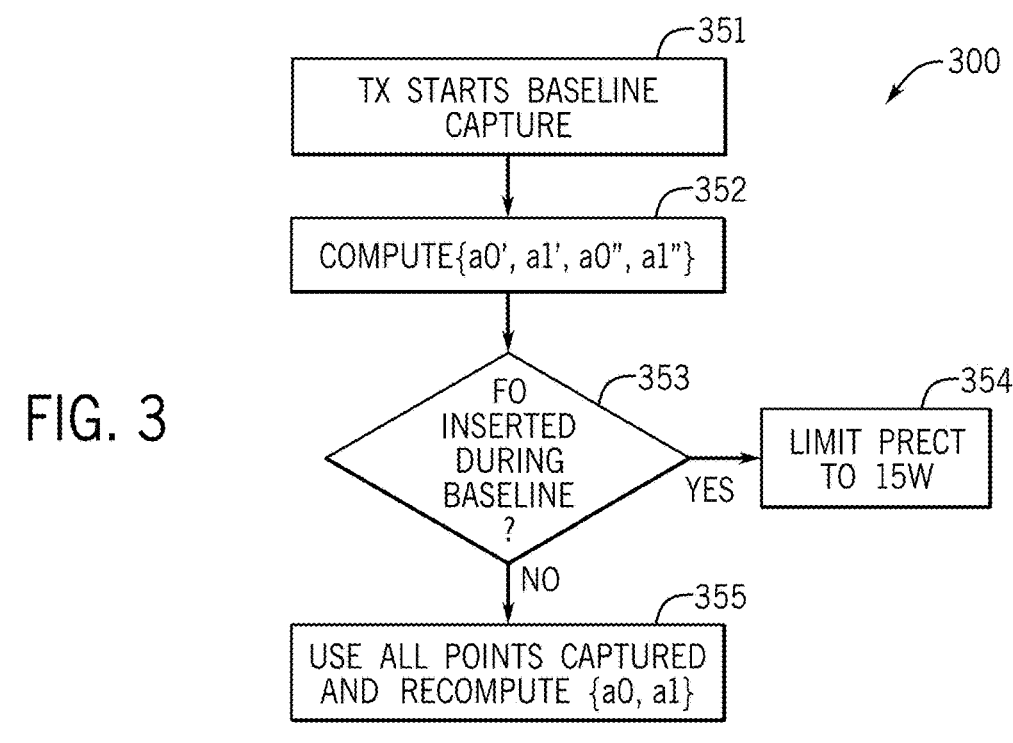
FIG. 3 illustrates a flowchart of portions of a power loss foreign object detection technique for use in a wireless power transfer system.

FIG. 3 illustrates a process flowchart 300 of coefficient determination of a power loss foreign object detection technique for use in a wireless power transfer system. FIG.

Figure 4:
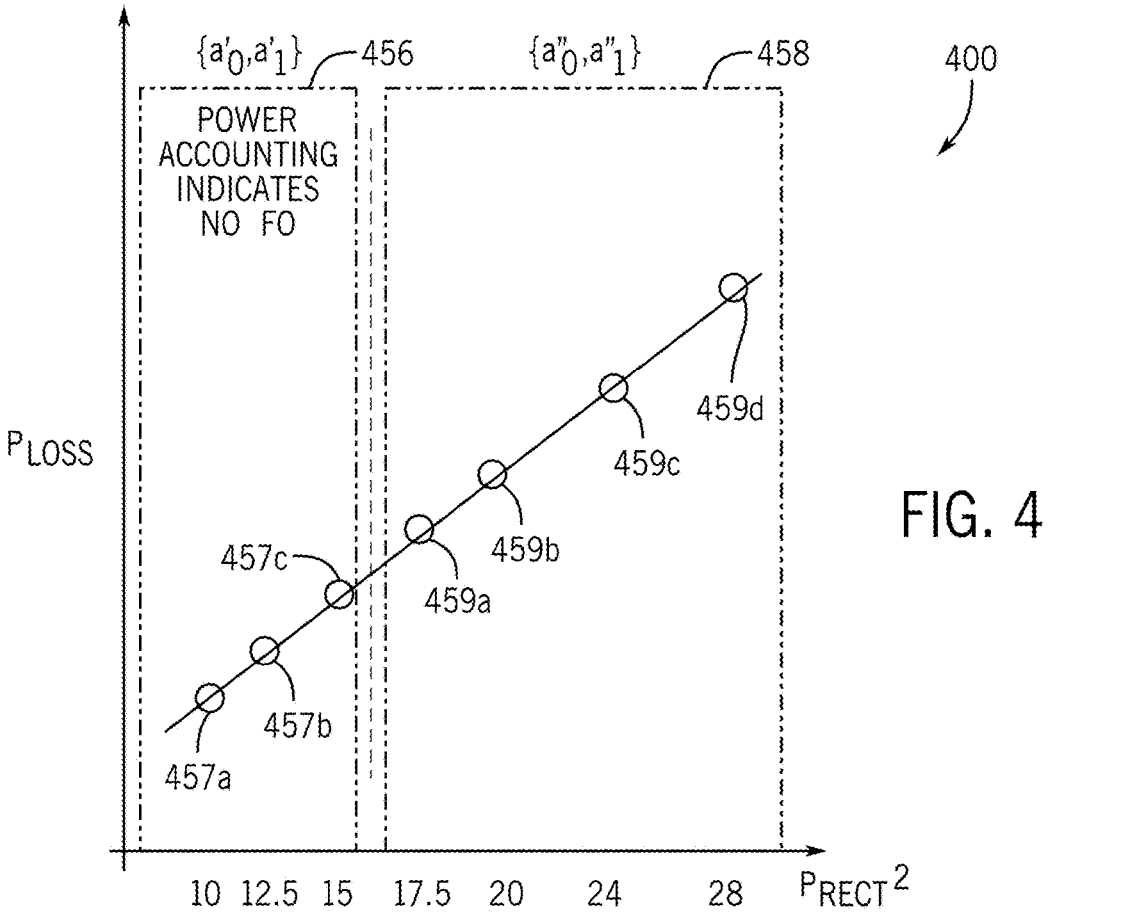
FIG. 4 illustrates a plot of power measurements in various phases of a power loss foreign object detection technique.

4 illustrates a plot 400 of power measurements in various phases of a power loss foreign object detection technique. These two figures will be explained together to describe the process of determining the coefficients for the power loss foreign object detection technique. FIG. 4 illustrates a plot 400 of the square of received power measurements $$(P_{RECT}^2)$$

from the wireless power receiver on the x-axis versus the power loss determined by the wireless power transmitter ($P_{LOSS}$) on the y-axis. These two parameters exhibit a linear relationship that can be described by the equation:

$$P_{LOSS} = \alpha_0 + \alpha_1 P_{RECT}^2 \qquad (P_{LOSS}: \text{EQ. 1a})$$

where $\alpha_0$ and $\alpha_1$ are fit coefficients that can be determined by performing a linear regression analysis, such as that described below. Alternatively, during power transfer, a PLOSS value may be computed using:

$$P_{LOSS} = \alpha_0 + \alpha_1 P_{RECT} \qquad (P_{LOSS}: \text{EQ. 1b})$$

This calculation of $P_{LOSS}$ may be more appropriate where the wireless power receiver varies its rectifier voltage ($V_{RECT}$) target during higher level power transfer in the delta power loss active phase (e.g., phase 249 in FIG. 2).

For example, beginning in region 456 of FIG. 4, which can correspond to initial operating period 242 depicted in FIG. 2, a wireless power transmitter can receive from a wireless power receiver a plurality of received power values measured by the wireless power receiver, which correspond to the x-axis coordinate of data points 457a-457c. The wireless power transmitter can determine a power loss associated with each of these data points, which correspond to the y-axis coordinate of data points 457a-457c. In one embodiment, the wireless power transmitter can then compute coefficients $$\alpha_0'$$

and $$\alpha_1',$$

using a linear regression analysis on points 457a-457c. Although three points are illustrated, the actual computation may use differing numbers of points depending on the granularity with which the desired data is captured, which can vary depending on the requirements of a particular implementation.

Then, in region 458 of FIG. 4, which can correspond to baseline recording period 247 depicted in FIG. 2, a wireless power transmitter can receive from a wireless power receiver a further plurality of received power values measured by the wireless power receiver, which correspond to the x-axis coordinate of data points 459a-459d. The wireless power transmitter can determine a power loss associated with each of these data points, which correspond to the y-axis coordinate of data points 459a-459d. In one embodiment, the wireless power transmitter can then compute coefficients $$\alpha_0''$$

and $$\alpha_1'',$$

using a linear regression analysis on points 459a-459d. Although four points are illustrated, the actual computation may use differing numbers of points depending on the granularity with which the desired data is captured, which can vary depending on the requirements of a particular implementation. Computation of the $$\alpha_0'$$

and $$\alpha_1'$$

coefficients and the $$\alpha_0''$$

and $$\alpha_1''$$

coefficients correspond to blocks 351 and 352 of the flow chart 300 illustrated in FIG. 3.

As indicated above, during the initial operating period 242 (region 456 of FIG. 4) the absence of a foreign object can be determined by operation of one or more foreign object detection techniques described in the applications incorporated by reference above. Thus, the coefficients $$\alpha_0'$$

and $$\alpha_1'$$

are taken as accurate based on such determinations. To ensure that no foreign object has been introduced during baseline capture period 247 (region 458 of FIG. 4), a comparison can be made between the $$\alpha_0'$$

and $$\alpha_1'$$

coefficients and the $$\alpha_0''$$

and $$\alpha_1''.$$

For example, the values of $$\alpha_0'$$

and $$\alpha_0''$$

can be compared, and the values of $$\alpha_1'$$

and $$\alpha_1''$$

can be compared, and if they are within an acceptable tolerance, it can be assumed that no foreign object was introduced during baseline capture period 247 (region 458 of FIG. 4) of the delta power loss regime. Another possible comparison would be to compute a $P_{LOSS}$ value using the $$\alpha_0'$$

and $$\alpha_1'$$

coefficients and the $P_{RECT}$ value corresponding to data point 459*d* and compare the computed value with the determined $P_{LOSS}$ value that is the actual y-coordinate of data point

459*d*. If the values are within an appropriate tolerance, which can be computed based on the requirements of a particular implementation, then it can be assumed that no foreign object was introduced during baseline capture period 247 (region 458 of FIG. 4). The two preceding examples are merely exemplary of various ways in which the respective coefficients can be compared to determine whether a foreign object was inserted during the baseline capture period 242, with such operations being depicted in block 353 of flowchart 300 in FIG. 3.

If it is determined that a foreign object was introduced during the baseline capture period (in block 353), then, as depicted in block 354, the wireless power transmission can be limited to a relatively lower value, e.g., the first value of 15 W. Although 15 W is used as the upper end of a lower power operating regime in the illustrated example, other power levels for this boundary could also be implemented. Otherwise, if it is determined that no foreign object was introduced during the baseline capture period (in block 353), then all captured data points, e.g., data points 457*a*-457*c* captured during the initial operating period 242 (region 456 of FIG. 4) and data points 459*a*-459*d* captured during the baseline capture period 247 (region 458 of FIG. 4) can be used to recompute coefficients $\alpha_0$ and $\alpha_1$. Alternatively, a subset of the total number of data points could be used if desired or appropriate for a given application.

Figure 5:
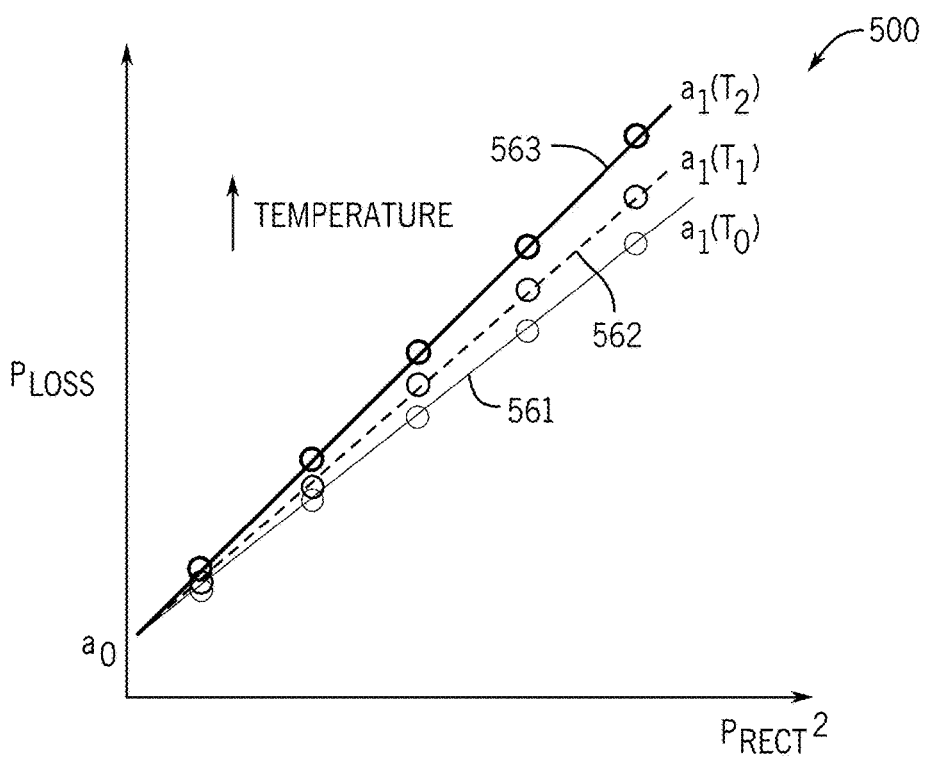
FIG. 5 illustrates a plot of power measurements of a power loss foreign object detection technique at different temperatures.

In at least some applications, temperature can influence the relationship between wireless power received and reported by the wireless power receiver and the losses measured by the wireless power transmitter. For example, particularly when operating at higher transmitted power levels, increases in transmitted power can cause increased losses that would otherwise affect the coefficients computed as described above. FIG. 5 illustrates a plot 500 of power measurements of a power loss foreign object detection technique at different temperatures. More specifically, plot 500 shows three curves (lines) 561, 562, 563 fit to data points corresponding to the same $$P_{RECT}^2$$

values at increasing temperatures T0, T1, T2. This plot 500 and curves 561, 562, 563 illustrate higher $P_{LOSS}$ values for the same $$P_{RECT}^2$$

values as temperature increases.

The coefficients, particularly the $\alpha_1$ coefficient, can be updated as a function of temperature using power loss measurements made at different temperatures. In practice, the actual operating temperature may not be known, as there are various components in both the wireless power transmitter and the wireless power receiver that have different thermal mass and other heat transfer properties. However, as a general principle, temperature will increase when operating until eventually reaching a thermal steady state at some time after the power transfer level reaches its own steady state. Thus, the coefficients can be updated periodically (i.e., at various times) until they stabilize at the steady state operating temperature of the wireless power transmitter/wireless power receiver system.

Figure 6:
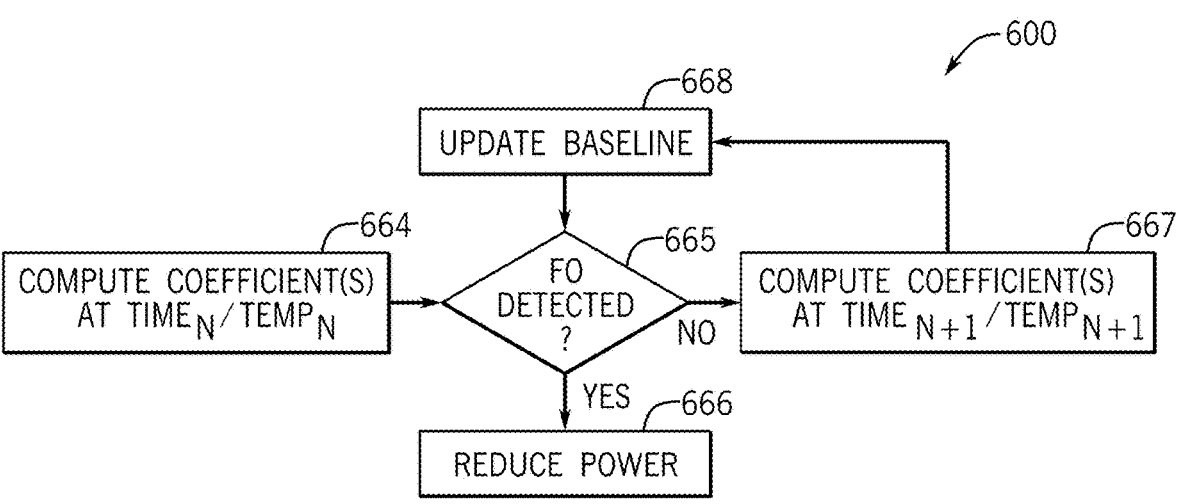
FIG. 6 illustrates a flowchart of a temperature compensation technique for a power loss foreign object detection technique.

FIG. 6 illustrates a process flowchart 600 of a temperature compensation technique for a power loss foreign object detection technique. The temperature compensation technique may optionally be used in conjunction with the coefficient determination technique described above with respect to FIGS. 3 and 4. Beginning with block 664, fit coefficients can be computed at a first time $Time_n$ corresponding to a first (potentially unknown) temperature $Temp_n$. This coefficient computation can be as described above with reference to FIGS. 2-4. Then, after passage of some period of time, in block 665, it can be determined whether a foreign object is present. This determination can be made by comparing a predicted $P_{LOSS}$ value computed using the coefficients determined in block 664 to a measured $P_{LOSS}$ value based on the present value of $P_{RECT}$. If a foreign object is detected in block 665, then power can be reduced (block 666). Otherwise, if no foreign object is present, then new coefficients can be computed at time $Time_{n+1}$ corresponding to temperature $Temp_{n+1}$ (also potentially unknown). These coefficients can then be used to update the baseline (block 668) by replacing the previously computed coefficients from block 664 with the updated coefficients computed in block 667. This process can then repeat, with a further foreign object detection (block 665) and subsequent coefficient update (block 667) occurring after another period of time. This can allow for the baseline values to be updated to account for temperature increases, associated with continued operation at higher power levels along with temperature decreases, e.g., those associated with operation at decreasing/lower power levels as illustrated in the right hand portion of FIG. 2. In some cases, updating of the baseline (block 668) may be skipped if the change in the computed coefficients is relatively small and/or the time interval between re-computations may be increased (or decreased if the difference in coefficients is relatively large).

Figure 7:
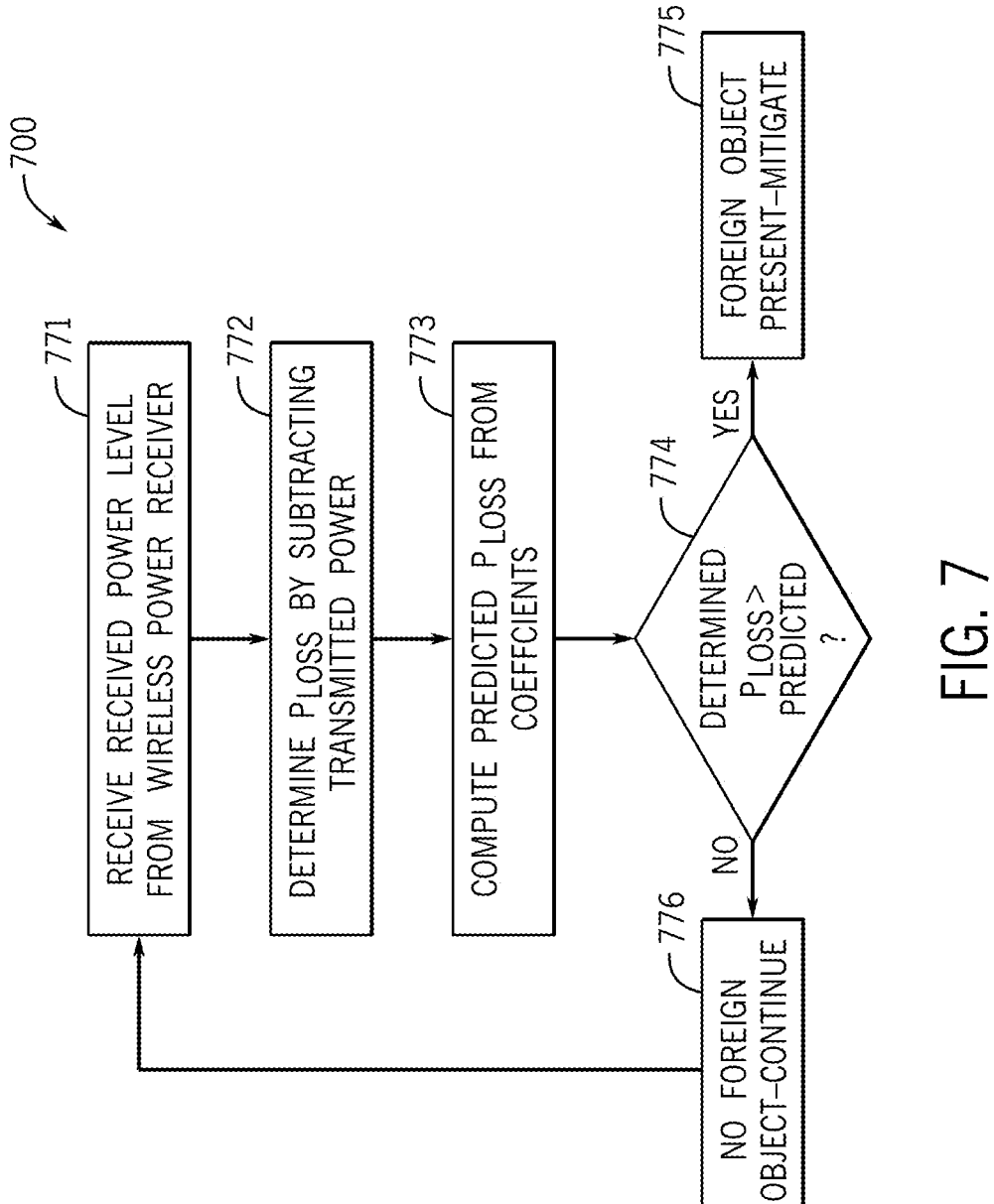
FIG. 7 illustrates a flowchart of a power loss foreign object detection technique for use in a wireless power transfer system.

FIG. 7 illustrates a process flowchart 700 of a power loss foreign object detection technique for use in a wireless power transfer system. Beginning with block 771, a wireless power transmitter can receive data from a wireless power receiver indicating a received power level. The wireless power receiver can determine the received power level by monitoring various voltages and/or currents, for example voltages or currents associated with the wireless power receiving coil and/or rectifier described above with reference to FIG. 1. In some embodiments, received power (also described herein as "receiver power") can be determined (approximated) by the receiver multiplying the rectifier output voltage and rectifier output current. Although this is the rectifier output power, both the rectifier output voltage and rectifier output current being DC quantities can simplify the measurement and computation of the relevant values. In other embodiments, the rectifier input voltage and current or other suitable voltages and/or currents could be used, as desired. In some embodiments, the wireless power receiver can transmit the calculated receiver power to the wireless power transmitter. In other embodiments, the wireless power receiver can translate the underlying measured values, such as voltage and current, to the wireless power transmitter. The transmission of receiver power information can utilize in-band or out-of-band communications as described above.

In block 772, the wireless power transmitter can determine a $P_{LOSS}$ value corresponding to the received wireless power value, e.g., by subtracting the receiver power from the transmitter's own measurement of transmitter power. In some embodiments, transmitter power can be determined (approximated) by the transmitter multiplying the inverter input voltage and inverter input current. Although this is the inverter input power, both the inverter input voltage and inverter input current being DC quantities can simplify the measurement and computation of the relevant values. In other embodiments, the inverter output voltage and current or other suitable voltages and/or currents could be used, as desired to determine transmitter power.

In block 773, the wireless power transmitter can compute a predicted $P_{LOSS}$ value based on fit coefficients derived during the baseline measurement phase using a process as described above with respect to FIGS. 2-4. The coefficients may also optionally be temperature compensated using a process like that described above with respect to FIGS. 5-6 or other suitable process. The determination of the measured $P_{LOSS}$ and the computation of the predicted $P_{LOSS}$ can take place in any order or simultaneously, depending on the implementation.

In block 774, the wireless power transmitter can determine whether the determined $P_{LOSS}$ value (i.e., the transmitted power value measured by the wireless power transmitter minus the received power value reported by the wireless power receiver) exceeds the predicted $P_{LOSS}$ value (computed using the baseline model) by a threshold. The threshold may be a static or dynamic and can be predetermined and/or computed or updated periodically as required. In any case if the difference between the measured and predicted power loss is greater than such a threshold, then it may be inferred that a foreign object is present and mitigation steps can be taken (block 775). Such mitigation steps can include reducing output power to a lower level selected to reduce or eliminate the likelihood of undesirable heating of such a foreign object or can include interrupting or ceasing wireless power transfer entirely. Otherwise, if the difference between the measured and predicted power loss does not exceed the threshold, then it can be inferred that no foreign object is present (block 776) or if a foreign object is present, temperature effects on the foreign object will remain within acceptable limits, and thus wireless power transfer can continue at the present level, with the process repeating as necessary (illustrated by the return to block 771).

Embodiment 2: Determining $P_{LOSS}$ Based on $V_{RECT}^2/I_{RECT}^2$ Measurements In the above examples, the expected power loss for the wireless power transfer system was estimated as a function of rectifier power $$(\text{i.e., } P_{RECT}^2),$$

with fit coefficients to estimate an expected power loss being derived from a regression analysis. In some embodiments, variations on this technique may be employed. As one example, the estimated losses could be computed as a function of one or more other parameters, such as PTx inverter input voltage (Vin) output current (Itx), PRx rectifier output voltage (Vrect), receiver current (Irect), etc. One or more of these variables may be used in a regression analysis as described above to derive coefficients that can be used to derive system power losses. Such regression analyses may be based on a linear regression, as described above, or other regression models, such as exponential, logarithmic, polynomial, etc. Additionally, as power in an electrical system is proportional to the square of the current and/or the square of the voltage, the squares of the various parameters described above may be used as part of the estimation routine. Such regression models can optionally include an offset term (e.g., a DC term) that can be a constant such as the $\alpha 0$ terms described above.

Figure 8:
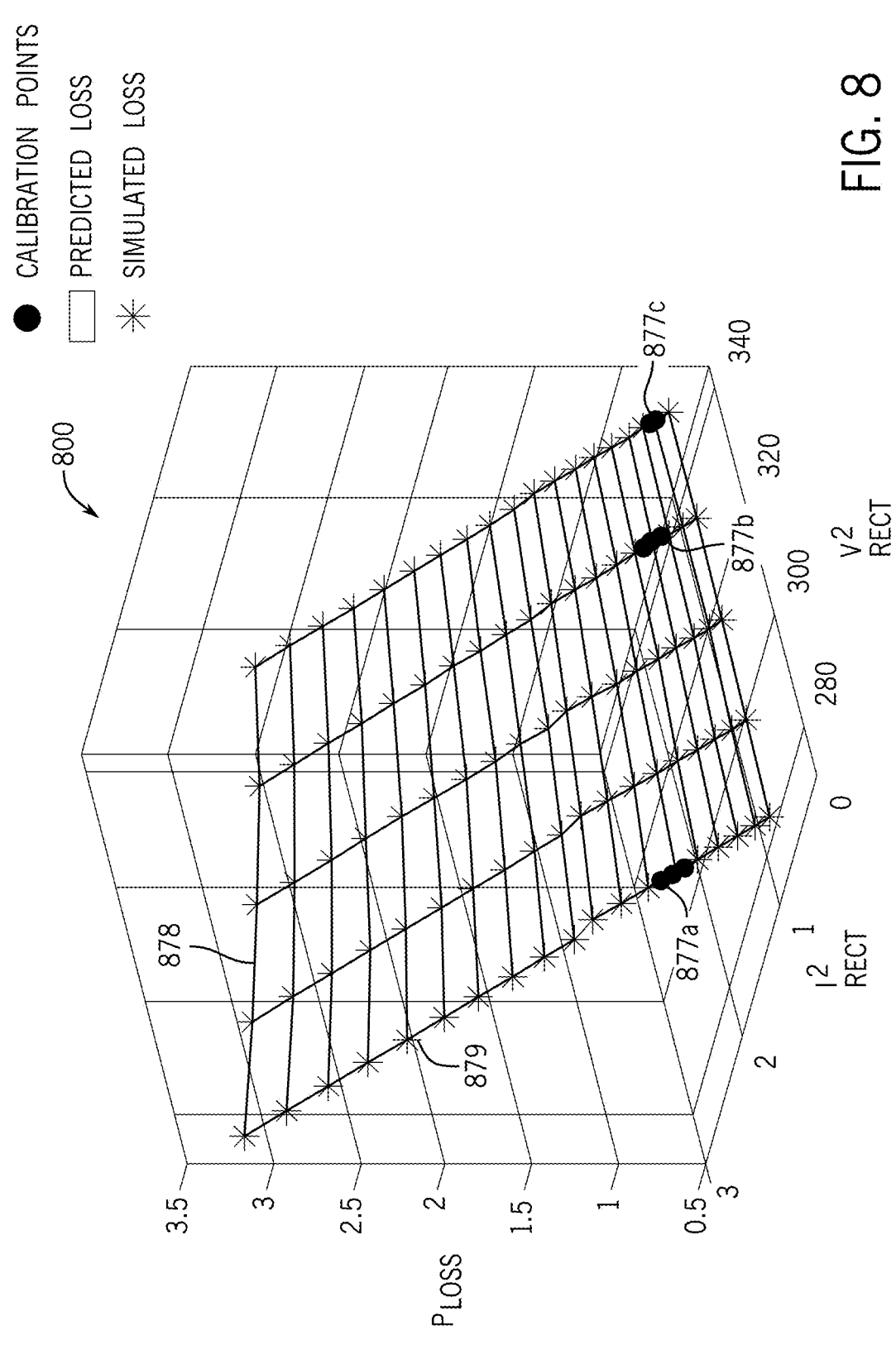
FIG. 8 illustrates a plot of power measurements and estimated losses for use in a power loss foreign object detection technique.

In some embodiments, illustrated using plot 800 of FIG. 8, system losses may be estimated as a function of the square of the PRx rectifier voltage ($V_{rect}$) and square of the rectifier current ($I_{rect}$). In other words, the losses may be estimated by:

$$P_{loss} = \alpha V_{rect}^2 + \beta I_{rect}^2 \qquad (P_{loss}: EQ.\ 2)$$

where $\alpha$ and $\beta$ are regression fit coefficients computed using techniques as described above. System losses can be estimated from a plurality of $V_{rect}$ and $I_{rect}$ baselining points 877a, 877b, . . . , 877c measured by the wireless power receiver and optionally communicated to a wireless power transmitter as described in greater detail below with respect to FIG. 9. More specifically, three or more baselining points (such as four, five, or more baselining points) can allow for the baselining technique described below. Either the wireless power receiver or the wireless power transmitter can compute the $P_{loss}$ function coefficients and/or perform the baselining checks described in greater detail below. These baselining points can be used to compute regression coefficients $\alpha$ and $\beta$ of the above $P_{loss}$ function, which can define a plane 878. Likewise, the $P_{loss}$ function can be used to calculate, for any $V_{rect}/I_{rect}$ values a predicted power loss 879, which will lie on the computed plane, with these calculated $P_{loss}$ values being used during power transfer as described in greater detail below.

To confirm validity of the baselining points, an optional baselining procedure can be performed by the wireless power receiver and/or the wireless power transmitter, more specifically by one or more processors included in the control and communication circuitry of such devices. The baselining can optionally include two (or more) steps.

In a first step, the baselining points 877a, 877b, . . . , 877c can be checked to determine that they define a plane; in other words, that they are sufficiently non-collinear to define a single plane rather than an infinite number of planes. This check can be performed in a variety of ways. In one embodiment, a matrix A can be constructed from the $V_{rect}$ and $I_{rect}$ measurements as follows:

$$A = \begin{bmatrix} V_{rect,1}^2 & I_{rect,1}^2 \\ V_{rect,2}^2 & I_{rect,2}^2 \\ \vdots & \vdots \\ V_{rect,n}^2 & I_{rect,n}^2 \end{bmatrix}$$

where $V_{rect,n}$ and $I_{rect,n}$ are corresponding rectifier voltage/current pairs. As can be seen, three or more baselining points may be used to determine the regression coefficients. The determinant of this matrix times its transpose, i.e., $$\left| A^T A \right|$$

is an indication whether the points are collinear. More specifically, if the determinant is zero then the baselining points are collinear, whereas a non-zero value indicates that the baselining points are not collinear. To ensure a sufficient degree of non-collinearity, the determinant may be scaled by the number of points and compared to a threshold to determine whether the points are sufficiently non-collinear for the baselining to be valid. In other words, the condition:

$$\frac{A^T A}{N^2} > cal\_check\_threshold$$

can indicate that the baselining is valid. Other algorithms could alternatively be used to determine that the baselining points are sufficiently non-collinear (i.e., sufficiently linearly independent) to define a suitable predicted loss plane.

A second baselining check can be performed to verify that the baselining points fit on a sufficiently flat (i.e., two-dimensional) plane and not a paraboloid or other higher order surface. In other words, the baselining points are expected to fit (within a reasonable margin) on a plane of exactly two dimensions. One way to check this is to verify that the maximum absolute value of a compensated power loss $P_{loss}$, compensated, minus the corresponding $$\alpha V_{rect}^2$$

and $$\beta I_{rect}^2$$

terms does not exceed a maximum fit error, in other words:

$$\max_i \left| P_{loss,compensated,i} - \alpha V_{rect}^2 + \beta I_{rect}^2 \right| < fit\_error\_max$$

can be an indication of sufficient planarity of the plane defined by the computed regression coefficients. The compensated power loss, $P_{loss_{compensated}}$, can be the lost power adjusted by removing the power loss in the PTx coil. This adjustment can be used to remove changes in the loss contributions of the Tx side, for example, $C_{TX}$ tuning capacitors. or changes in the power loss of the PTx coil that occur if some other parameter or parameters change. Further details of an example computation of $P_{loss_{compensated}}$ are described below with reference to Embodiment 3.

During power transfer, a $\Delta P_{loss}$ value may be computed as:

$$\Delta P_{loss} = (P_{Ptx} - P_{Prx}) - P_{loss} \qquad (\Delta P_{loss}: EQ.\ 3a)$$

where $P_{Ptx}$ is the transmitter power, $P_{Prx}$ is the receiver, and $P_{loss}$ is computed as described above. As noted above, transmitter power can be determined or estimated using the inverter input voltage and current, which are DC quantities, or any other suitable PTx voltage and/or current values. Likewise, the receiver power can be determined or estimated using the rectifier output voltage and current, which are DC quantities, or any other suitable PRx voltage and/or current values. Sometimes, $P_{Ptx}$ is referred to as $P_{in}$ and $P_{Prx}$ is referred to as a $P_{rect}$. Use of voltage and/or current values does not preclude the use or transmission of power values from PRx to PTx. If this $\Delta P_{loss}$ value is greater than a threshold, the presence of a foreign object is inferred, and mitigations can be performed as described above. Alternatively, during power transfer, a delta Ploss value may be computed using an equation that accounts for transmitter $I^2R$ losses such as the equation below:

$$\Delta P_{loss} = \left(P_{Ptx} - P_{Prx} - R_{circuit,tx} \cdot I_{TX}^2\right) - P_{loss} \qquad (\Delta P_{loss}: EQ.\ 3b)$$

Figure 9:
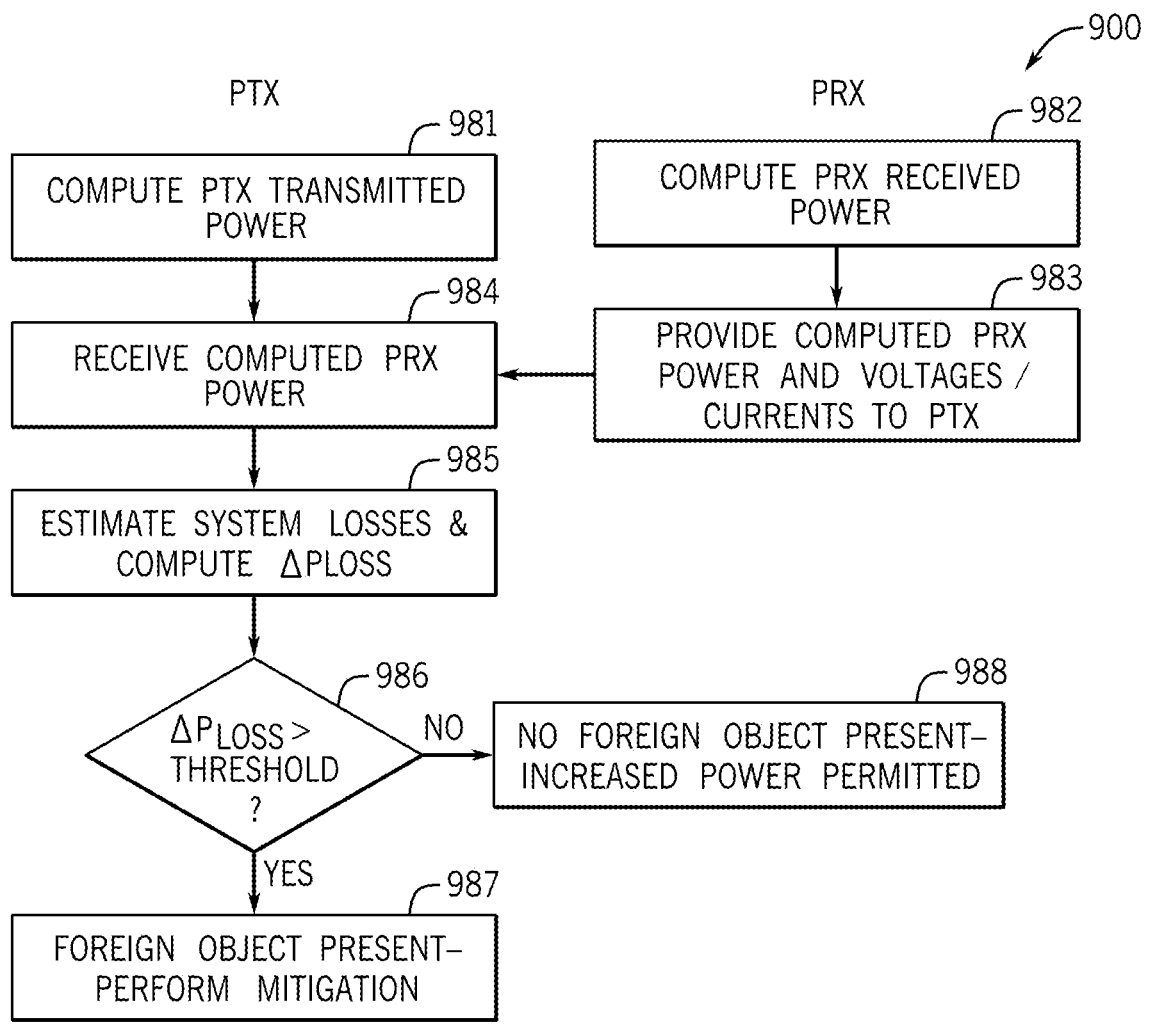
FIG. 9 illustrates a flowchart of an alternative power loss foreign object detection technique for use in a wireless power transfer system.

FIG. 9 is a flowchart 900 of an alternative power loss foreign object detection technique for use in a wireless power transfer system incorporating a modified model utilizing $V_{rect}$ and $I_{rect}$, as described above. In block 981, a wireless power transmitter (PTx) can compute transmitter power as described above. Likewise, in block 982, a wireless power receiver (PRx) can compute receiver power in a similar fashion (as also described above) Alternatively, rather than computing receiver power, the PRx device can report its relevant voltage(s) and/or current(s) directly to the PTx. The PTx can then perform the power computation itself. This reporting can take place over the wireless power link between the PTx and PRx, e.g., using in-band communication such as ASK to transmit one or more data packets that include the relevant voltage and current information. In block 983, the PRx can provide this computed received power (and/or the relevant voltage and current parameters to calculate it) to the PTx device, which receives such data in block 984. In block 985, the PTx device can compute estimated system losses, for example based on the square of rectifier voltage $$\left(V_{rect}^2\right)$$

and square of rectifier current $$\left(I_{rect}^2\right)$$

and using coefficients previously computed as described above. Additionally in block 985, the PTx can compute $\Delta P_{loss}$ as described in the preceding paragraph (EQ. 3a or 3b). In some embodiments, block 985 can also include one or more baselining steps as described above with reference to FIG. 8.

In block 986, the computed $\Delta P_{loss}$ value can be compared to a threshold value to determine whether a foreign object is present. If the computed $\Delta P_{loss}$ exceeds the threshold, then it can be inferred that a foreign object is present (block 987) and mitigation steps such as limiting, reducing, pausing, and/or stopping power transfer can be performed. For example, power may be reduced to the first threshold level described above, e.g., 15 W. Otherwise, if the computed $\Delta P_{loss}$ does not exceed the threshold, then it can be inferred that a foreign object is not present (block 988), and increased power levels can be permitted.

Embodiment 3: Additional Aspects of Determining $\Delta P_{LOSS}$ Based on $V_{RECT}^2/I_{RECT}^2$ Measurements Like the above-discussed embodiments, calculating $\Delta P_{LOSS}$ can include measuring the overall system loss at a single instance and comparing it to a baseline value. $P_{LOSS}$ can be defined simply by calculating the difference between power transmitted and power received. Thus:

$$P_{LOSS} = P_{INV} - P_{RECT}$$

where $P_{LOSS}$ is the lost power, $P_{INV}$ is the power transmitted (i.e., inverter power), and $P_{RECT}$ is the power received (i.e., rectifier power). Furthermore, $P_{loss_{compensated}}$ can be the lost power adjusted by removing the power loss in the PTx coil or changes in the power loss of the PTx coil that occur if one or more parameters change. This adjustment can be used to remove changes in the loss contributions of the Tx side, for example, $C_{TX}$ tuning capacitors. Thus:

$$P_{LOSS_{COMPENSATED}} = P_{LOSS} - R_{circuit,tx}\, I_{TX}^2$$

where $P_{loss_{compensated}}$ is the compensated power loss, $P_{LOSS}$ is computed as described above, $R_{circuit,tx}$ is the resistance of the transmitter circuit and $I_{TX}$ is the transmitter side current. During runtime, $R_{circuit,tx}$ includes the ESR (internal resistance, i.e., equivalent or effective series resistance) of the selected $C_{TX}$ plus any switches. In at least some cases, $P_{loss_{compensated}}$ can be easier to compute than other power loss accounting techniques, which can depend on extensive simulation and measurement to determine a fit for calculating foreign object power $P_{FO}$.

As briefly described above with reference to FIG. 8, determining $\Delta P_{LOSS}$ based on $V_{RECT}^2$ and $I_{RECT}^2$ measurements can include a baselining procedure. One objective of the baselining procedure can be to record the loss profile of the PTx and PRx devices versus $$V_{RECT}^2$$

and $$I_{RECT}^2.$$

The relationship can be modeled as a three-dimensional linear plane illustrated in FIG. 8 and discussed above. More specifically, baselining can be performed by collecting three or more points (including four, five, or more baselining points) with various $V_{RECT}$ and $P_{RECT}$ values during the initial power transfer phase. As one example, this baselining can take place at a relatively lower power level, e.g., below 15 W, although any appropriate low power level could be selected, including levels greater than or less than 15 W. When initially ramping up power (and thus $V_{RECT}$ and/or $I_{RECT}$), a slight pause at each $V_{RECT}/I_{RECT}$ value pair may be employed to collect and/or calculate stable data. This can have the effect of slowing down initial power ramp up, which, in turn, can increase charge time, so collecting fewer data points may be preferable. In at least some simulated embodiments, three data points have been found to provide sufficient margin to predict the rest of the plane. However, greater numbers of points could be used if desired.

As one example, three baselining data points can be selected as three equally spaced points across the $V_{RECT}$ and $P_{RECT}$ target range, for example:

1 Point at $V_{RECT_{MIN}}$, $P_{RECT_{MAX}}$ (e.g., point 877a; FIG. 8)

1 Point at $V_{RECT_{NOM}}$, $P_{RECT_{NOM}}$ (e.g., point 877b; FIG. 8)

1 Point at $V_{RECT_{MAX}}$, $P_{RECT_{MIN}}$ (e.g., point 877c; FIG. 8)

At least three points of $P_{RECT}$ and $V_{RECT}$ are needed to calculate the $\alpha$ and $\beta$ coefficients as defined above in Eq. 2. In one embodiment, 25 samples can be taken at each location to average out any additional system noise. However, other numbers of samples ranging from 1 to 50, 100, or even more samples could be taken at each point. Once a sample is taken at a given point, the validity can be verified by confirming that an applicable power loss accounting foreign object power threshold is still within boundary.

In at least some embodiments, a PTx device can take these three points and fit $\alpha$ and $\beta$ coefficients to the following equation (which corresponds to EQ. 2 as described above).

$$P_{LOSS_{COMPENSATED}} = \alpha V_{RECT}^2 + \beta I_{RECT}^2$$

More specifically, during the baselining phase, the PRx can send back $P_{RECT}$, $V_{RECT}$, and $I_{RECT}$ measurements to the PTx. The PRx can also control the points at which the baselining is performed. The PTx can be responsible for computing the linear fit. These packets can be treated similar to MPLA (magnetic power loss accounting) packets as described in the Qi 2 specification promulgated by the Wireless Power Consortium, in that PTx/PRx synchronization is needed. The $\alpha$ and $\beta$ coefficients can be calculated (e.g., by the PTx) using a series of sums. To derive the calculation, with the following two sums, in which $P_{LOSS\_COMPENSATED}$ is abbreviated $P_{LC}$ for brevity:

$$\sum_i V_{i,RECT}^2 P_{i,LC} = \alpha \sum_i V_{i,RECT}^4 + \beta \sum_i V_{i,RECT}^2 I_{i,RECT}^2$$

$$\sum_i I_{i,RECT}^2 P_{i,LC} = \alpha \sum_i V_{i,RECT}^2 I_{i,RECT}^2 + \beta \sum_i I_{i,RECT}^4$$

with two equations and two unknowns, $\alpha$ and $\beta$, can be solved for, namely:

$$\alpha = \frac{\sum_i V_{i,RECT}^2 P_{i,LC} \sum_i I_{i,RECT}^4 - \sum_i V_{i,RECT}^2 I_{i,RECT}^2 \sum_i I_{i,RECT}^2 P_{i,LC}}{\sum_i V_{i,RECT}^4 \sum_i I_{i,RECT}^4 - \left(\sum_i V_{i,RECT}^2 I_{i,RECT}^2\right)^2}$$

and $$\beta = \frac{\sum_i I_{i,RECT}^2 P_{i,LC} \sum_i V_{i,RECT}^4 - \sum_i V_{i,RECT}^2 I_{i,RECT}^2 \sum_i V_{i,RECT}^2 P_{i,LC}}{\sum_i V_{i,RECT}^4 \sum_i I_{i,RECT}^4 - \left(\sum_i V_{i,RECT}^2 I_{i,RECT}^2\right)^2}$$

These values then need to be confirmed to be valid. Various check algorithms are described in greater detail below.

A linear baselining check and fit error check as described below can be used to ensure that the fitting is well-conditioned. A linear baselining check can be performed by checking how close to singularity the data is. The below equations (similar to equation described above with respect to Embodiment 2) define that process. As discussed above, a matrix A can be constructed from the $V_{rect}$ and $I_{rect}$ measurements as follows:

$$A = \begin{bmatrix} V_{RECT,1}^2 & I_{RECT,1}^2 \\ V_{RECT,2}^2 & I_{RECT,2}^2 \\ \vdots & \vdots \\ V_{RECT,n}^2 & I_{RECT,n}^2 \end{bmatrix}$$

where $V_{rect,n}$ and $I_{rect,n}$ are corresponding rectifier voltage/current pairs. As can be seen, three or more baselining points (such as four, five, or more baselining points) may be used to determine the regression coefficients. The determinant of this matrix times its transpose, i.e., $$|A^T A|$$

is an indication whether the points are collinear.

More specifically, if the determinant is zero then the baselining points are collinear, whereas a non-zero value indicates that the baselining points are not collinear. The matrix ATA is given by:

$$A^T A = \begin{bmatrix} \sum_{i=1}^{N} V_{RECT,i}^4 & \sum_{i=1}^{N} V_{RECT,i}^2 I_{RECT,i}^2 \\ \sum_{i=1}^{N} V_{RECT,i}^2 I_{RECT,i}^2 & \sum_{i=1}^{N} I_{RECT,i}^4 \end{bmatrix}$$

Thus, the determinant is given by:

$$|A^T A| = \sum_{i=1}^{N} V_{RECT,i}^4 \sum_{i=1}^{N} I_{RECT,i}^4 - \left(\sum_{i=1}^{N} V_{RECT,i}^2 I_{RECT,i}^2\right)^2$$

To ensure a sufficient degree of non-collinearity, the determinant may be scaled by the number of points and compared to a threshold to determine whether the points are sufficiently non-collinear for the baselining to be valid. In other words, the example condition $$\frac{|A^T A|}{N^2} < 1$$

can indicate that the baselining is valid. Other algorithms could alternatively be used to determine that the baselining points are sufficiently non-collinear (i.e., sufficiently linearly independent) to define a suitable predicted loss plane.

A second baselining check can be performed to verify that the baselining points fit on a sufficiently flat (i.e., two-dimensional) plane and not a paraboloid or other higher order surface. In other words, the baselining points are expected to fit, within a reasonable margin, on a plane of exactly two dimensions. Thus, after the $\alpha$ and $\beta$ coefficients are calculated, the maximum fit error can be calculated to confirm a good baselining. One way to check this is to verify that the maximum absolute value of a compensated power loss $P_{loss\_compensated}$, minus the corresponding $$\alpha V_{rect}^2$$

and $$\beta I_{rect}^2$$

terms does not exceed a maximum fit error, in other words:

$$\text{Max} Error = \max_i \left( \left| P_{loss,compensated,i} - \alpha V_{rect}^2 - \beta I_{rect}^2 \right| \right)$$

This is a point wise calculation of the measured $P_{LOSS\_COMPENSATED}$ versus the predicted loss. As described above, if this maximum error exceeds a pre-determined threshold, then the fit is invalid, and the system can revert to other power loss accounting schemes (e.g., MPLA) and/or limit the power (e.g., to 15 W).

$\Delta P_{LOSS}$ can be evaluated (e.g., by the PTx) on receipt of its complimentary packet (e.g., from the PRx), and if the threshold is exceeded, the system can limit power, e.g., by reverting to a 15 W operation mode. $\Delta P_{LOSS}$ can be given by:

$$\Delta P_{LOSS} = P_{LOSS\_COMPENSATED} - \left( \alpha V_{RECT,i}^2 + \beta I_{RECT,i}^2 \right)$$

which is substantially the same as EQ. 3a discussed above with respect to Embodiment 2. A grace period, such as 8 seconds, is given for missing packets. After that the system can restart so as to provide a complete initiation procedure. Otherwise, ΔPloss can be active once baselining is complete and the rectified power exceeds a low power threshold, e.g., 15 W (although other power thresholds could be employed). The system can switch back to an alternative scheme (e.g., MPLA) when the rectified power remains below some threshold value, e.g., 10 W (although other thresholds could be used). This may be desirable to account for reduced accuracy in ΔPloss below 10 W (or other suitable threshold) caused by different operating conditions such as phase modulation on the PTx side.

In the foregoing description, it has been anticipated that the foreign object detection techniques described herein will be performed by a wireless power transmitter, and more particularly, by suitably programmed or configured control circuitry of the wireless power transmitter, which can be constructed (for example) as described above with respect to FIG. 1. However, it could also be possible for all or part of the functionality to be performed by a wireless power receiver having suitably programmed control circuitry. Such an arrangement might require slightly different control flows and communications but would nonetheless be similar in construction and operation to the systems and methods described herein.

Additional Items:

Item 1. A method performed by control circuitry of a wireless power transmitter for detecting a foreign object influenced by an electromagnetic field associated with wireless power transfer from the wireless power transmitter to a wireless power receiver, the method comprising:

receiving from the wireless power receiver an indication of receiver power associated with the wireless power transfer including or derived from a corresponding rectifier voltage and rectifier current of the wireless power receiver;

determining a measured power loss associated with the wireless power transfer by comparing the indication of receiver power to a transmitter power measured by the wireless power transmitter;

computing a predicted power loss based on the indication of receiver power associated with the wireless power transfer including or derived from a corresponding rectifier voltage or rectifier current of the wireless power receiver and one or more coefficients corresponding to a baseline wireless power transmission between the wireless power transmitter and the wireless power receiver; and determining that a foreign object is present if the measured power loss exceeds the predicted power loss by more than a threshold.

Item 2. The method of item 1 wherein the received indication of received power is the rectifier voltage and rectifier current and the method further comprises computing receiver power based on the rectifier voltage and rectifier current.

Item 3. The method of item 1 wherein the rectifier voltage is a rectifier output voltage, and the rectifier current is a rectifier output current.

Item 4. The method of item 1 wherein the transmitter power is computed by the wireless power transmitter by multiplying an inverter input voltage by an inverter input current.

Item 5. The method of item 1 further comprising computing the one or more coefficients corresponding to the baseline wireless power transmission between the wireless power transmitter and the wireless power receiver by:

receiving from the wireless power receiver a plurality of indications of receiver power including or derived from corresponding rectifier voltages and rectifier currents of the wireless power receiver associated with the wireless power transfer;

determining a plurality of measured power loss values each corresponding to one of the plurality of indications of received power levels associated with the wireless power transfer by comparing an indication of receiver power to a corresponding transmitter power measured by the wireless power transmitter; and performing a regression analysis on the received plurality of indications of receiver power and corresponding rectifier voltages and rectifier currents of the wireless power receiver associated with the wireless power transfer and the determined plurality of measured power loss values to compute the one or more coefficients.

Item 6. The method of item 5 wherein receiving from the wireless power receiver a plurality of indications of receiver power including or derived from corresponding rectifier voltages and rectifier currents of the wireless power receiver associated with the wireless power transfer comprises receiving the plurality of indications at three or more operating points.

Item 7. The method of item 6 wherein the three or more operating points include an operating point at minimum rectifier voltage and maximum receiver power, an operating point at nominal rectifier voltage and nominal receiver power, and an operation point at maximum rectifier voltage and minimum receiver power.

Item 8. The method of item 6 wherein the plurality of indications at three or more operating points includes a plurality of samples at each of the three or more operating points.

Item 9. The method of item 8 wherein the plurality of samples at each of the three or more operating points includes 25 or more samples at each of the three or more operating points.

Item 10. The method of item 5 wherein the one or more coefficients include a first coefficient relating to the rectifier voltage and a second coefficient relating to the rectifier current.

Item 11. The method of item 10 wherein the predicted power loss is of the form:

$$P_{loss} = \alpha V_{rect}^2 + \beta I_{rect}^2$$

where $\alpha$ is the first coefficient relating to the rectifier voltage, and $\beta$ is the second coefficient relating to the rectifier current.

Item 12. The method of item 5 wherein performing the regression analysis on the received plurality of indications of receiver power associated with the wireless power transfer and the determined plurality of measured power loss values to compute the one or more coefficients further comprises performing a baselining procedure that includes determining that the plurality of indications of receiver power are linearly independent.

Item 13. The method of item 12 wherein the baselining procedure further includes determining that the plurality of indications of receiver power lie in a two-dimensional plane.

Item 14. The method of item 12 wherein performing the regression analysis on the received plurality of indications of receiver power and corresponding rectifier voltages and rectifier currents of the wireless power receiver associated with the wireless power transfer and the determined plurality of measured power loss values to compute the one or more coefficients comprises:

computing a first plurality of coefficients corresponding to an initial operating period with a wireless power transfer level below a first threshold in which the absence of a foreign object is indicated by another foreign object detection technique;

computing a second plurality of coefficients corresponding to a baseline capture period with a wireless power transfer level above the first threshold; and comparing the first and second plurality of coefficients to determine whether a foreign object was introduced during the baseline capture period.

Item 15. The method of item 1 further comprising, if a foreign object is present, mitigating presence of the foreign object by reducing a power level of or suspending the wireless power transfer.

Item 16. A method performed by control circuitry of a wireless power transmitter for computing one or more coefficients corresponding to a baseline wireless power transmission between the wireless power transmitter and a wireless power receiver to be used in detecting a foreign object influenced by an electromagnetic field associated with wireless power transfer from the wireless power transmitter to the wireless power receiver, the method comprising:

receiving from the wireless power receiver a plurality of indications of receiver power levels including or derived from corresponding rectifier voltages and rectifier currents of the wireless power receiver associated with the wireless power transfer;

determining a plurality of measured power loss values each corresponding to one of the plurality of indications of receiver power associated with the wireless power transfer by comparing an indication of receiver power to a corresponding transmitter power measured by the wireless power transmitter; and performing a regression analysis on the received plurality of indications of receiver power including or derived from corresponding rectifier voltages and rectifier currents of the wireless power receiver associated with the wireless power transfer and the determined plurality of measured power loss values to compute the one or more coefficients.

Item 17. The method of item 16 wherein the rectifier voltage is a rectifier output voltage, and the rectifier current is a rectifier output current.

Item 18. The method of item 16 wherein the transmitter power is computed by the wireless power transmitter by multiplying an inverter input voltage by an inverter input current.

Item 19. The method of item 16 wherein receiving from the wireless power receiver a plurality of indications of receiver power including or derived from corresponding rectifier voltages and rectifier currents of the wireless power receiver associated with the wireless power transfer comprises receiving the plurality of indications at three or more operating points.

Item 20. The method of item 19 wherein the three or more operating points include an operating point at minimum rectifier voltage and maximum receiver power, an operating point at nominal rectifier voltage and nominal receiver power, and an operation point at maximum rectifier voltage and minimum receiver power.

Item 21. The method of item 19 wherein the plurality of indications at three or more operating points includes a plurality of samples at each of the three or more operating points.

Item 22. The method of item 21 wherein the plurality of samples at each of the three or more operating points includes 25 or more samples at each of the three or more operating points.

Item 23. The method of item 16 wherein the one or more coefficients include a first coefficient relating to the rectifier voltage and a second coefficient relating to the rectifier current.

Item 24. The method of item 23 further comprising computing a predicted power loss based on the corresponding rectifier voltage and rectifier current and the one or more coefficients, wherein the predicted power loss is of the form:

$$P_{loss} = \alpha V_{rect}^2 + \beta I_{rect}^2$$

where $\alpha$ is the first coefficient relating to the rectifier voltage, and $\beta$ is the second coefficient relating to the rectifier current.

Item 25. The method of item 16 wherein performing the regression analysis on the received plurality of indications of receiver power and corresponding rectifier voltages and rectifier currents of the wireless power receiver associated with the wireless power transfer and the determined plurality of measured power loss values to compute the one or more coefficients further comprises performing a baselining procedure that includes determining that the plurality of indications of received power levels are linearly independent.

Item 26. The method of item 25 wherein the baselining procedure includes determining that the plurality of indications of received power levels lie in a two-dimensional plane.

Item 27. A wireless power transmitter comprising:

a wireless power transmitter coil configured to magnetically couple to a wireless power receiver coil of a wireless power receiver to wirelessly transfer power to the wireless power receiver;

an inverter configured to receive input power and generate an output that drives the wireless power transmitter coil; and controller and communication circuitry coupled to the inverter and the wireless power transmitter coil that controls the inverter to regulate wireless power transfer to the wireless power receiver, wherein the controller and communication circuitry includes logic or programming that detects a foreign object influenced by an electromagnetic field associated with wireless power transfer to the wireless power receiver by:

receiving from the wireless power receiver an indication of receiver power associated with the wireless power transfer including or derived from a corresponding rectifier voltage and rectifier current of the wireless power receiver;

determining a measured power loss associated with the wireless power transfer by comparing the indication of receiver power to a transmitter power measured by the wireless power transmitter;

computing a predicted power loss based on the indication of receiver power associated with the wireless power transfer including or derived from a corresponding rectifier voltage and rectifier current of the wireless power receiver and one or more coefficients corresponding to a baseline wireless power transmission between the wireless power transmitter and the wireless power receiver; and determining that a foreign object is present if the measured power loss exceeds the predicted power loss by more than a threshold.

Item 28. The wireless power transmitter of item 27 wherein the rectifier voltage is a rectifier output voltage, and the rectifier current is a rectifier output current.

Item 29. The wireless power transmitter of item 27 wherein the transmitter power is computed by the wireless power transmitter by multiplying an inverter input voltage by an inverter input current.

Item 30. The wireless power transmitter of item 27, wherein the controller and communication circuitry further comprise logic or programming that computes the one or more coefficients corresponding to the baseline wireless power transmission between the wireless power transmitter and the wireless power receiver by:

receiving from the wireless power receiver a plurality of indications of receiver power including or derived from corresponding rectifier voltages and rectifier currents of the wireless power receiver associated with the wireless power transfer;

determining a plurality of measured power loss values each corresponding to one of the plurality of indications of receiver power associated with the wireless power transfer by comparing an indication of receiver power to a corresponding transmitted wireless power level measured by the wireless power transmitter; and performing a regression analysis on the received plurality of indications of receiver power including or derived from corresponding rectifier voltages and rectifier currents of the wireless power receiver associated with the wireless power transfer and the determined plurality of measured power loss values to compute the one or more coefficients.

Item 31. The wireless power transmitter of item 30 wherein receiving from the wireless power receiver a plurality of indications of receiver power including or derived from corresponding rectifier voltages and rectifier currents of the wireless power receiver associated with the wireless power transfer comprises receiving the plurality of indications at three or more operating points.

Item 32. The wireless power transmitter of item 31 wherein the three or more operating points include an operating point at minimum rectifier voltage and maximum receiver power, an operating point at nominal rectifier voltage and nominal receiver power, and an operation point at maximum rectifier voltage and minimum receiver power.

Item 33. The wireless power transmitter of item 31 wherein the plurality of indications at three or more operating points includes a plurality of samples at each of the three or more operating points.

Item 34. The wireless power transmitter of item 33 wherein the plurality of samples at each of the three or more operating points includes 25 or more samples at each of the three or more operating points.

Item 35. The wireless power transmitter of item 27 wherein the one or more coefficients include a first coefficient relating to the rectifier voltage and a second coefficient relating to the rectifier current.

Item 36. The wireless power transmitter of item 35 wherein the predicted power loss is of the form:

$$P_{loss} = \alpha V_{rect}^2 + \beta I_{rect}^2$$

where $\alpha$ is the first coefficient relating to the rectifier voltage, and $\beta$ is the second coefficient relating to the rectifier current.

Item 37. The wireless power transmitter of item 27 wherein performing the regression analysis on the received plurality of indications of receiver power including or derived from corresponding rectifier voltages and rectifier currents of the wireless power receiver associated with the wireless power transfer and the determined plurality of measured power loss values to compute the one or more coefficients includes performing a baselining procedure including determining that the plurality of indications of receiver power are linearly independent.

Item 38. The wireless power transmitter of item 37 wherein the baselining procedure further includes determining that the plurality of indications of receiver power lie in a two-dimensional plane.

Item 39. The wireless power transmitter of item 27 wherein the controller and communication circuitry further comprise logic or programming that, if a foreign object is present, mitigates presence of the foreign object by reducing a power level of or suspending the wireless power transfer.

Item 40. A wireless power transmitter comprising:

a wireless power transmitter coil configured to magnetically couple to a wireless power receiver coil of a wireless power receiver to wirelessly transfer power to the wireless power receiver;

an inverter configured to receive input power and generate an output that drives the wireless power transmitter coil; and controller and communication circuitry coupled to the inverter and the wireless power transmitter coil that controls the inverter to regulate wireless power transfer to the wireless power receiver, wherein the controller and communication circuitry includes logic or programming that that computes one or more coefficients corresponding to a baseline wireless power transmission between the wireless power transmitter and the wireless power receiver by:

receiving from the wireless power receiver a plurality of indications of receiver power including or derived from corresponding rectifier voltages and rectifier currents of the wireless power receiver associated with the wireless power transfer;

determining a plurality of measured power loss values each corresponding to one of the plurality of indications of receiver power associated with the wireless power transfer by comparing an indication of receiver power to a corresponding transmitted wireless power level measured by the wireless power transmitter; and performing a regression analysis on the received plurality of indications of receiver power including or derived from corresponding rectifier voltages and rectifier currents of the wireless power receiver associated with the wireless power transfer and the determined plurality of measured power loss values to compute the one or more coefficients.

Item 41. The wireless power transmitter of item 40 wherein the rectifier voltage is a rectifier output voltage, and the rectifier current is a rectifier output current.

Item 42. The wireless power transmitter of item 40 wherein the transmitter power is computed by the wireless power transmitter by multiplying an inverter input voltage by an inverter input current.

Item 43. The wireless power transmitter of item 40 wherein receiving from the wireless power receiver a plurality of indications of receiver power including or derived from corresponding rectifier voltages and rectifier currents of the wireless power receiver associated with the wireless power transfer comprises receiving the plurality of indications at three or more operating points.

Item 44. The wireless power transmitter of item 43 wherein the three or more operating points include an operating point at minimum rectifier voltage and maximum receiver power, an operating point at nominal rectifier voltage and nominal receiver power, and an operation point at maximum rectifier voltage and minimum receiver power.

Item 45. The wireless power transmitter of item 43 wherein the plurality of indications at three or more operating points includes a plurality of samples at each of the three or more operating points.

Item 46. The wireless power transmitter of item 45 wherein the plurality of samples at each of the three or more operating points includes 25 or more samples at each of the three or more operating points.

Item 47. The wireless power transmitter of item 40 wherein the one or more coefficients include a first coefficient relating to the rectifier voltage and a second coefficient relating to the rectifier current.

Item 48. The wireless power transmitter of item 47 wherein the controller and communication circuitry further comprise logic or programming that computes a predicted power loss based on the corresponding rectifier voltage and rectifier current and the one or more coefficients, and wherein the predicted power loss is of the form:

$$P_{loss} = \alpha V_{rect}^2 + \beta I_{rect}^2$$

where $\alpha$ is the first coefficient relating to the rectifier voltage, and $\beta$ is the second coefficient relating to the rectifier current.

Item 49. The wireless power transmitter of item 40 wherein performing the regression analysis on the received plurality of indications of receiver power including or derived from corresponding rectifier voltages and rectifier currents of the wireless power receiver associated with the wireless power transfer and the determined plurality of measured power loss values to compute the one or more coefficients includes performing a baselining procedure including determining that the plurality of indications of received power levels are linearly independent.

Item 50. The wireless power transmitter of item 49 wherein the baselining procedure further includes determining that the plurality of indications of received power levels lie in a two-dimensional plane.

Described above are various features and embodiments relating to foreign object detection in wireless power transfer systems. Such arrangements may be used in a variety of applications but may be particularly advantageous when used in conjunction with electronic devices such as mobile phones, tablet computers, laptop or notebook computers, and accessories, such as wireless headphones, styluses, etc. Additionally, although numerous specific features and various embodiments have been described, it is to be understood that, unless otherwise noted as being mutually exclusive, the various features and embodiments may be combined various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The foregoing describes exemplary embodiments of wireless power transfer systems that are able to transmit certain information between the PTx and PRx in the system. The present disclosure contemplates this passage of information improves the devices' ability to provide wireless power signals to each other in an efficient manner to facilitate battery charging, such as by sharing of the devices' power handling capabilities with one another. Entities implementing the present technology should take care to ensure that, to the extent any sensitive information is used in particular implementations, that well-established privacy policies and/ or privacy practices are complied with. In particular, such entities would be expected to implement and consistently apply privacy practices that are generally recognized as meeting or exceeding industry or governmental requirements for maintaining the privacy of users. Implementers should inform users where personally identifiable information is expected to be transmitted in a wireless power transfer system and allow users to "opt in" or "opt out" of participation. For instance, such information may be presented to the user when they place a device onto a power transmitter, if the power transmitter is configured to poll for sensitive information from the power receiver.

The invention claimed is:

1. A method performed by control circuitry of a wireless power transmitter for detecting a foreign object influenced by an electromagnetic field associated with wireless power transfer from the wireless power transmitter to a wireless power receiver, the method comprising:

receiving from the wireless power receiver an indication of receiver power associated with the wireless power transfer;

determining a measured power loss associated with the wireless power transfer by comparing the indication of receiver power to a transmitter power measured by the wireless power transmitter;

computing a predicted power loss based on the indication of receiver power associated with the wireless power transfer and one or more coefficients corresponding to a baseline wireless power transmission between the wireless power transmitter and the wireless power receiver;

determining that a foreign object is present responsive to the measured power loss exceeding the predicated power loss by more than a threshold; and responsive to determining that the foreign object is present, mitigating presence of the foreign object by reducing a power level of or suspending the wireless power transfer to the wireless power receiver using the wireless power transfer coil.

2. The method of claim 1 wherein the received indication of received power is the rectifier voltage and rectifier current, and the method further comprises computing receiver power based on the rectifier voltage and rectifier current.

3. The method of claim 1 wherein the rectifier voltage is a rectifier output voltage, and the rectifier current is a rectifier output current.

4. The method of claim 1 wherein the transmitter power is computed by the wireless power transmitter by multiplying an inverter input voltage by an inverter input current.

5. The method of claim 1 further comprising computing the one or more coefficients corresponding to the baseline wireless power transmission between the wireless power transmitter and the wireless power receiver by:

receiving from the wireless power receiver a plurality of indications of receiver power including or derived from corresponding rectifier voltages and rectifier currents of the wireless power receiver associated with the wireless power transfer;

determining a plurality of measured power loss values each corresponding to one of the plurality of indications of received power levels associated with the wireless power transfer by comparing an indication of receiver power to a corresponding transmitter power measured by the wireless power transmitter; and performing a regression analysis on the received plurality of indications of receiver power and corresponding rectifier voltages and rectifier currents of the wireless power receiver associated with the wireless power transfer and the determined plurality of measured power loss values to compute the one or more coefficients.

6. The method of claim 5 wherein receiving from the wireless power receiver a plurality of indications of receiver power including or derived from corresponding rectifier voltages and rectifier currents of the wireless power receiver associated with the wireless power transfer comprises receiving the plurality of indications at three or more operating points.

7. The method of claim 6 wherein the three or more operating points include an operating point at minimum rectifier voltage and maximum receiver power, an operating point at nominal rectifier voltage and nominal receiver power, and an operation point at maximum rectifier voltage and minimum receiver power.

8. The method of claim 6 wherein the plurality of indications at three or more operating points includes a plurality of samples at each of the three or more operating points.

9. The method of claim 8 wherein the plurality of samples at each of the three or more operating points includes 25 or more samples at each of the three or more operating points.

10. The method of claim 1 wherein the one or more coefficients include a first coefficient relating to the rectifier voltage and a second coefficient relating to the rectifier current.

11. The method of claim 10 wherein the predicted power loss is of the form:

$$P_{loss} = \alpha V_{rect}^2 + \beta I_{rect}^2$$

where $\alpha$ is the first coefficient relating to the rectifier voltage, and $\beta$ is the second coefficient relating to the rectifier current.

12. The method of claim 5 wherein performing the regression analysis on the received plurality of indications of receiver power associated with the wireless power transfer and the determined plurality of measured power loss values to compute the one or more coefficients further comprises performing a baselining procedure that includes determining that the plurality of indications of receiver power are linearly independent.

13. The method of claim 12 wherein the baselining procedure further includes determining that the plurality of indications of receiver power lie in a two-dimensional plane.

14. The method of claim 12 wherein performing the regression analysis on the received plurality of indications of receiver power and corresponding rectifier voltages and rectifier currents of the wireless power receiver associated with the wireless power transfer and the determined plurality of measured power loss values to compute the one or more coefficients comprises:

computing a first plurality of coefficients corresponding to an initial operating period with a wireless power transfer level below a first threshold in which the absence of a foreign object is indicated by another foreign object detection technique;

computing a second plurality of coefficients corresponding to a baseline capture period with a wireless power transfer level above the first threshold; and comparing the first and second plurality of coefficients to determine whether a foreign object was introduced during the baseline capture period.

15. A wireless power transmitter comprising:

a wireless power transmitter coil configured to magnetically couple to a wireless power receiver coil of a wireless power receiver to wirelessly transfer power to the wireless power receiver;

an inverter configured to receive input power and generate an output that drives the wireless power transmitter coil; and controller and communication circuitry coupled to the inverter and the wireless power transmitter coil that controls the inverter to regulate wireless power transfer to the wireless power receiver, wherein the controller and communication circuitry includes logic or programming that detects a foreign object influenced by an electromagnetic field associated with wireless power transfer to the wireless power receiver by:

receiving from the wireless power receiver an indication of receiver power associated with the wireless power transfer;

determining a measured power loss associated with the wireless power transfer by comparing the indication of receiver power to a transmitter power measured by the wireless power transmitter;

computing a predicted power loss based on the indication of receiver power and one or more coefficients corresponding to a baseline wireless power transmission between the wireless power transmitter and the wireless power receiver; and determining that a foreign object is present if the measured power loss exceeds the predicted power loss by more than a threshold; and responsive to determining that the foreign object is present, mitigating presence of the foreign object by reducing a power level of or suspending the wireless power transfer using the wireless power transfer coil.

16. A wireless power transmitter comprising:

a wireless power transmitter coil configured to magnetically couple to a wireless power receiver coil of a wireless power receiver to wirelessly transfer power to the wireless power receiver;

an inverter configured to receive input power and generate an output that drives the wireless power transmitter coil; and controller and communication circuitry coupled to the inverter and the wireless power transmitter coil that controls the inverter to regulate wireless power transfer to the wireless power receiver, wherein the controller and communication circuitry includes logic or programming that that computes one or more coefficients corresponding to a baseline wireless power transmission between the wireless power transmitter and the wireless power receiver by:

receiving from the wireless power receiver a plurality of indications of receiver power associated with the wireless power transfer;

determining a plurality of measured power loss values each corresponding to one of the plurality of indications of receiver power associated with the wireless power transfer by comparing an indication of receiver power to a corresponding transmitted wireless power level measured by the wireless power transmitter; and performing a regression analysis on the received plurality of indications of receiver power associated with the wireless power transfer and the determined plurality of measured power loss values to compute the one or more coefficients.

17. A method performed by control circuitry of a wireless power transmitter for controlling wireless power transfer from the wireless power transmitter to a wireless power receiver, the method comprising:

during an initial wireless power transfer period at or below a first power level:

receiving from the wireless power receiver (i) a plurality of indications of power received by the wireless power receiver ($P_{rect}$) and (ii) a plurality of corresponding rectifier voltages ($V_{rect}$) and rectifier currents ($I_{rect}$) of the wireless power receiver, responsive to power transmitted wirelessly by the wireless power transmitter ($P_{inv}$);

determining a relationship of (i) the plurality of $P_{rect}$ and (ii) the complementary $V_{rect}$ and $I_{rect}$ of the wireless power receiver to a power loss ($P_{loss}$) between the wireless power transmitter and the wireless power receiver during wireless power transfer, wherein determining the relationship comprises determining at least a first coefficient relating $V_{rect}$ or $I_{rect}$ of the wireless power receiver to the power loss ($P_{loss}$);

during a subsequent wireless power transfer period at or above a second power level higher than the first power level:

receiving from the wireless power receiver (iii) at least one additional indication of power received by the wireless power receiver ($P_{rect}$) and (iv) corresponding additional rectifier voltage ($V_{rect}$) and additional rectifier current ($I_{rect}$) of the wireless power receiver, responsive to $P_{inv}$ transmitted by the wireless power transmitter; and responsive to determining that a power loss at the second power level ($P_{inv}-P_{rect}$) exceeds a power loss predicted from the determined relationship using (iii) and (iv) so as to indicate presence of a foreign object, reducing power transmitted by the wireless power transmitter to a level at or below the first power level.

18. The method of claim 17 wherein determining the relationship comprises fitting (i) and (ii) according to the relationship $P_{inv}-P_{rect}=\alpha V_{rect}^2+\beta I_{rect}^2$ wherein $\alpha$ and $\beta$ are the at least a first coefficient.

19. The method of claim 18 wherein $P_{inv}-P_{rect}$ provides an indication of power loss ($P_{loss}$) between the wireless power transmitter and the wireless power receiver during wireless power transfer.

20. The method of claim 17 wherein determining the relationship comprises fitting (i) and (ii) according to the relationship $P_{inv}-P_{rect}=\alpha_0+\alpha_1 P_{RECT}^2$, wherein $\alpha_0$ and $\alpha_1$ are the at least a first coefficient.

21. The method of claim 20 wherein $P_{inv}-P_{rect}$ provides an indication of power loss ($P_{loss}$) between the wireless power transmitter and the wireless power receiver during wireless power transfer.

22. The method of claim 1 wherein the one or more coefficients include an intercept coefficient and a slope coefficient, and the predicted power loss is of the form:

$$P_{LOSS} = \alpha_0 + \alpha_1 P_{RECT}^2;$$

where $\alpha0$ is the intercept coefficient and $\alpha1$ is the slope coefficient, and $P_{rect}$ is the indication of receiver power.

23. The method of claim 22 further comprising computing the one or more coefficients corresponding to the baseline wireless power transmission between the wireless power transmitter and the wireless power receiver by:

receiving from the wireless power receiver a plurality of indications of receiver power associated with the wireless power transfer;

determining a plurality of measured power loss values each corresponding to one of the plurality of indications of receiver power associated with the wireless power transfer by comparing an indication of receiver power level to a corresponding transmitter power measured by the wireless power transmitter; and performing a regression analysis on the received plurality of indications of receiver power associated with the wireless power transfer and the determined plurality of measured power loss values to compute the one or more coefficients.

24. The method of claim 23 wherein performing the regression analysis on the received plurality of indications of receiver power associated with the wireless power transfer and the determined plurality of measured power loss values to compute the one or more coefficients comprises:

performing a first regression analysis on a first subset of the received plurality of indications of receiver power associated with the wireless power transfer and the determined plurality of measured power loss values to compute a first set of one or more coefficients corresponding to an initial operating period with a wireless power transfer level below a first threshold in which the absence of a foreign object is indicated by another foreign object detection technique;

performing a second regression analysis on a second subset of the received plurality of indications of receiver power associated with the wireless power transfer and the determined plurality of measured power loss values to compute a second set of one or more coefficients corresponding to a baseline capture period with a wireless power transfer level above the first threshold; and comparing the first and second sets of one or more coefficients to determine whether a foreign object was introduced during the baseline capture period.

25. The wireless power transmitter of claim 15 wherein the transmitter power is computed by the wireless power transmitter by multiplying an inverter input voltage by an inverter input current.

26. The wireless power transmitter of claim 15 wherein the one or more coefficients include a first coefficient relating to a rectifier voltage and a second coefficient relating to a rectifier current.

27. The wireless power transmitter of claim 26 wherein the predicted power loss is of the form:

$$P_{loss} = \alpha V_{rect}^2 + \beta I_{rect}^2$$

where $\alpha$ is the first coefficient relating to the rectifier voltage, and $\beta$ is the second coefficient relating to the rectifier current.

28. The wireless power transmitter of claim 15, wherein the controller and communication circuitry further comprise logic or programming that computes the one or more coefficients corresponding to the baseline wireless power transmission between the wireless power transmitter and the wireless power receiver by:

receiving from the wireless power receiver a plurality of indications of receiver power associated with the wireless power transfer;

determining a plurality of measured power loss values each corresponding to one of the plurality of indications of receiver power associated with the wireless power transfer by comparing an indication of receiver power to a corresponding transmitted wireless power level measured by the wireless power transmitter; and performing a regression analysis on the received plurality of indications of receiver power associated with the wireless power transfer and the determined plurality of measured power loss values to compute the one or more coefficients.

29. The wireless power transmitter of claim 28 wherein receiving from the wireless power receiver a plurality of indications of receiver power associated with the wireless power transfer comprises receiving the plurality of indications at three or more operating points.

30. The wireless power transmitter of claim 29 wherein the plurality of indications at three or more operating points includes a plurality of samples at each of the three or more operating points.

31. The wireless power transmitter of claim 15 wherein performing the regression analysis on the received plurality of indications of receiver power including or derived from corresponding rectifier voltages and rectifier currents of the wireless power receiver associated with the wireless power transfer and the determined plurality of measured power loss values to compute the one or more coefficients includes performing a baselining procedure including determining that the plurality of indications of receiver power are linearly independent and lie in a two-dimensional plane.

32. The wireless power transmitter of claim 15 wherein the one or more coefficients include an intercept coefficient and a slope coefficient, and the predicted power loss is of the form:

$$P_{LOSS} = \alpha_0 + \alpha_1 P_{RECT}^2;$$

where $\alpha 0$ is the intercept coefficient and $\alpha 1$ is the slope coefficient, and $P_{rect}$ is the indication of receiver power.

33. The wireless power transmitter of claim 32 wherein the controller and communication circuitry computes the one or more coefficients corresponding to the baseline wireless power transmission between the wireless power transmitter and the wireless power receiver by:

receiving from the wireless power receiver a plurality of indications of receiver power associated with the wireless power transfer;

determining a plurality of measured power loss values each corresponding to one of the plurality of indications of receiver power associated with the wireless power transfer by comparing an indication of receiver power level to a corresponding transmitter power measured by the wireless power transmitter; and performing a regression analysis on the received plurality of indications of receiver power associated with the wireless power transfer and the determined plurality of measured power loss values to compute the one or more coefficients.

34. The wireless power transmitter of claim 33 wherein performing the regression analysis on the received plurality of indications of receiver power associated with the wireless power transfer and the determined plurality of measured power loss values to compute the one or more coefficients comprises:

performing a first regression analysis on a first subset of the received plurality of indications of receiver power associated with the wireless power transfer and the determined plurality of measured power loss values to compute a first set of one or more coefficients corresponding to an initial operating period with a wireless power transfer level below a first threshold in which the absence of a foreign object is indicated by another foreign object detection technique;

performing a second regression analysis on a second subset of the received plurality of indications of receiver power associated with the wireless power transfer and the determined plurality of measured power loss values to compute a second set of one or more coefficients corresponding to a baseline capture period with a wireless power transfer level above the first threshold; and comparing the first and second sets of one or more coefficients to determine whether a foreign object was introduced during the baseline capture period.

35. The wireless power transmitter of claim 16 wherein the transmitter power is computed by the wireless power transmitter by multiplying an inverter input voltage by an inverter input current.

36. The wireless power transmitter of claim 16 wherein receiving from the wireless power receiver a plurality of indications of receiver power associated with the wireless power transfer comprises receiving the plurality of indications at three or more operating points.

37. The wireless power transmitter of claim 36 wherein the plurality of indications at three or more operating points includes a plurality of samples at each of the three or more operating points.

38. The wireless power transmitter of claim 16 wherein the one or more coefficients include a first coefficient relating to the rectifier voltage and a second coefficient relating to the rectifier current.

39. The wireless power transmitter of claim 38 wherein the controller and communication circuitry further comprise logic or programming that computes a predicted power loss based on the corresponding rectifier voltage and rectifier current and the one or more coefficients, and wherein the predicted power loss is of the form:

$$P_{loss} = \alpha V_{rect}^2 + \beta I_{rect}^2$$

where $\alpha$ is the first coefficient relating to the rectifier voltage, and $\beta$ is the second coefficient relating to the rectifier current.

40. The wireless power transmitter of claim 16 wherein performing the regression analysis on the received plurality of indications of receiver power including or derived from corresponding rectifier voltages and rectifier currents of the wireless power receiver associated with the wireless power transfer and the determined plurality of measured power loss values to compute the one or more coefficients includes performing a baselining procedure including determining that the plurality of indications of received power levels are linearly independent and lie in a two-dimensional plane.

41. The wireless power transmitter of claim 16 wherein:

the regression analysis is a linear regression of received power or received power squared versus power loss resulting in an intercept coefficient $\alpha_0$ and a slope coefficient $\alpha_1$; and the predicted power loss is of the form: $P_{LOSS}=\alpha_0+\alpha_1 P_{RECT}^2$.

42. The wireless power transmitter of claim 16 wherein the controller and communication circuitry further temperature compensates the one or more coefficients by:

computing a first set of the one or more coefficients corresponding to the baseline wireless power transmission between the wireless power transmitter and the wireless power receiver at a first time corresponding to a first, potentially unknown, temperature;

responsive to not detecting a foreign object, computing a second set of the one or more coefficients corresponding to the baseline wireless power transmission between the wireless power transmitter and the wireless power receiver at a second time corresponding to a second, potentially unknown, temperature; and replacing the first set of the one or more coefficients with the second set of the one or more coefficients.

43. The wireless power transmitter of claim 16 wherein the transmitter power is computed by the wireless power transmitter by multiplying an inverter input voltage by an inverter input current.

44. The wireless power transmitter of claim 16 wherein receiving from the wireless power receiver a plurality of indications of receiver power associated with the wireless power transfer comprises receiving the plurality of indications at three or more operating points.

45. The wireless power transmitter of claim 44 wherein the plurality of indications at three or more operating points includes a plurality of samples at each of the three or more operating points.

46. The wireless power transmitter of claim 16 wherein performing the regression analysis on the received plurality of indications of receiver power and corresponding rectifier voltages and rectifier currents of the wireless power receiver associated with the wireless power transfer and the determined plurality of measured power loss values to compute the one or more coefficients further comprises performing a baselining procedure that includes determining that the plurality of indications of received power levels are linearly independent and lie in a two-dimensional plane.

* * * * *